(12) United States Patent
Chuang et al.

(10) Patent No.: US 11,107,881 B2
(45) Date of Patent: Aug. 31, 2021

(54) SEMICONDUCTOR PACKAGE DEVICES HAVING CONDUCTIVE LAYER, SEMICONDUCTOR WALL, CONDUCTIVE WALL, AND INSULATION LAYER

(71) Applicant: Advanced Semiconductor Engineering, Inc., Kaohsiung (TW)

(72) Inventors: Shao Hsuan Chuang, Kaohsiung (TW); Huang-Hsien Chang, Kaohsiung (TW); Min Lung Huang, Kaohsiung (TW); Yu Cheng Chen, Kaohsiung (TW); Syu-Tang Liu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/395,156

(22) Filed: Apr. 25, 2019

(65) Prior Publication Data

US 2020/0343336 A1    Oct. 29, 2020

(51) Int. Cl.
*H01L 49/02*    (2006.01)

(52) U.S. Cl.
CPC .............. *H01L 28/87* (2013.01); *H01L 28/91* (2013.01)

(58) Field of Classification Search
CPC . H01L 28/40–92; H01L 23/5222–5225; H01L 27/0805
See application file for complete search history.

(56) References Cited

U.S. PATENT DOCUMENTS

| | | | | |
|---|---|---|---|---|
| 6,121,084 | A * | 9/2000 | Coursey | H01L 28/84 438/255 |
| 2005/0205918 | A1* | 9/2005 | Abiko | H01L 23/5223 257/303 |
| 2007/0148899 | A1* | 6/2007 | Kim | H01L 28/91 438/396 |
| 2012/0212877 | A1* | 8/2012 | Lu | H01G 5/011 361/301.4 |
| 2016/0372372 | A1* | 12/2016 | Gambino | H01L 21/76251 |

OTHER PUBLICATIONS

U.S. Appl. No. 15/804,463, filed Nov. 6, 2017, Lee et al.

* cited by examiner

*Primary Examiner* — Nelson Garces
(74) *Attorney, Agent, or Firm* — Foley & Lardner LLP

(57) ABSTRACT

The subject application relates to a semiconductor package device, which includes a first conductive layer; a semiconductor wall disposed on the first conductive layer; a first conductive wall disposed on the first conductive layer; and an insulation layer disposed on the first conductive layer and between the semiconductor wall and the first conductive wall.

8 Claims, 27 Drawing Sheets

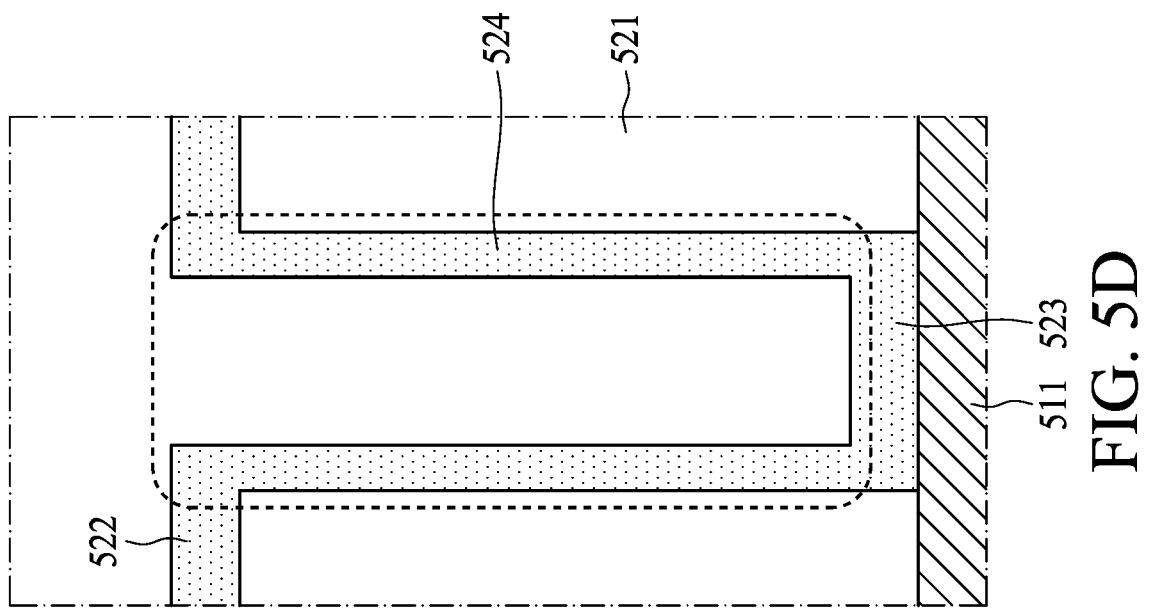

SEMICONDUCTOR PACKAGE DEVICES HAVING CONDUCTIVE LAYER, SEMICONDUCTOR WALL, CONDUCTIVE WALL, AND INSULATION LAYER

TECHNICAL FIELD

The present disclosure generally relates to semiconductor package devices. More particularly, the present disclosure relates to semiconductor package devices and methods of making the same.

BACKGROUND

Capacitors are passive components used in various electronic products, which go along with the trend of miniaturization. In other words, although size of the electronic product may be scaled down, same or relatively great capacitance may be used to maintain or improve performance. For example, capacitance density, which can be specified as capacitance per area (e.g. $nf/mm^2$) may play an important role in some electronic products.

SUMMARY

In some embodiments, a semiconductor package device is provided. The semiconductor package device includes a first conductive layer; a semiconductor wall disposed on the first conductive layer; a first conductive wall disposed on the first conductive layer; and an insulation layer disposed on the first conductive layer and between the semiconductor wall and the first conductive wall.

In some embodiments, a semiconductor package device is provided. The semiconductor package device includes a first conductive layer having conductive grains of a first average size; a first conductive wall disposed directly on the first conductive layer, the first conductive wall having conductive grains of a second average size; and an insulation layer disposed on the first conductive layer, wherein the first average size is different from the second average size.

In some embodiments, a method for manufacturing a semiconductor package device is provided. The method includes forming a first conductive layer; disposing a semiconductor wall directly on the first conductive layer; disposing a first conductive wall directly on the first conductive layer; disposing an insulation layer directly on the first conductive layer and surrounding the first conductive wall; and disposing a second conductive wall on the insulation layer; wherein the first conductive wall is separated from the second conductive wall by the insulation layer.

BRIEF DESCRIPTION OF THE DRAWINGS

Aspects of the present disclosure are readily understood from the following detailed description when read with the accompanying figures. It is noted that various features may not be drawn to scale, and the dimensions of the various features may be arbitrarily increased or reduced for clarity of discussion.

FIG. 5A, FIG. 5B, FIG. 5C, FIG. 5D, FIG. 5E, FIG. 5F, FIG. 5G, FIG. 5H illustrate a method for manufacturing a semiconductor package device in accordance with some embodiments of the present disclosure.

DETAILED DESCRIPTION

Figure 1A:
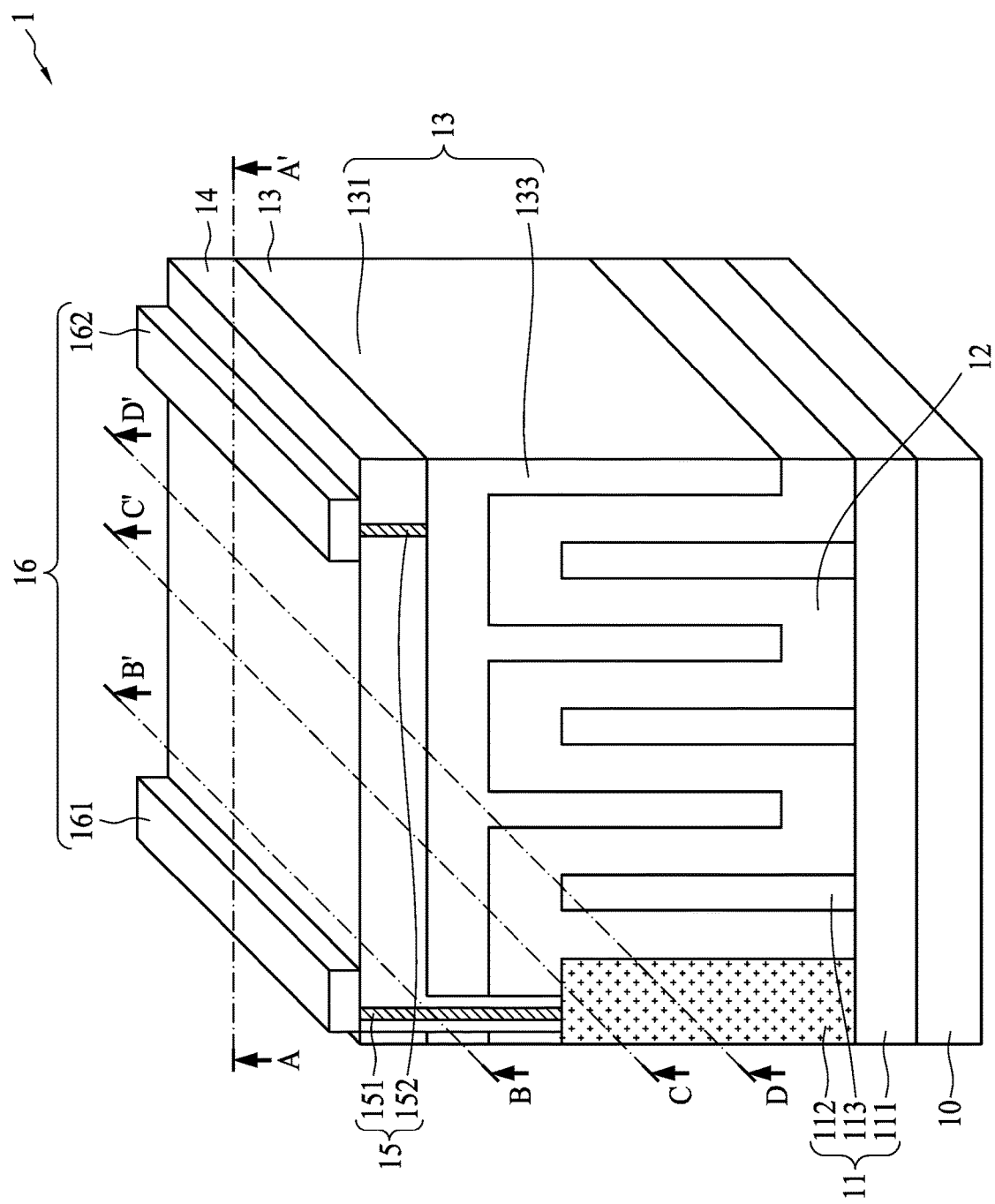
FIG. 1A is a perspective view of a semiconductor package device in accordance with some embodiments of the present disclosure.

Manufacturing and use of at least some embodiments of the present disclosure are discussed in detail below. It should be appreciated, however, that at least some embodiments set forth can deviate from the specific examples provided herein such that they can be implemented in a wide variety of specific contexts. It is to be understood that the following disclosure provides many different embodiments or examples of implementing different features of various embodiments. Specific examples of components and configurations are described below for purposes of discussion. These are, of course, merely examples and are not intended to be limiting.

Some embodiments, or examples, illustrated in the figures are disclosed below using specific language. It will nevertheless be understood that the embodiments and examples are not intended to be limiting. Any alterations and modifications of some of the disclosed embodiments, and any further applications of the principles disclosed in this document, as would normally occur to one of ordinary skill in the pertinent art, fall within the scope of this disclosure.

Further, it is understood that several processing steps (e.g., operations) and/or features of a device may be briefly described. Additional processing steps and/or features can be implemented, and certain of the processing steps and/or features described herein can be removed or changed while implementing the methods described herein or while using the systems and devices described herein. Thus, the following description should be understood to represent examples, and are not intended to suggest that one or more steps or features are required for every implementation.

In addition, the present disclosure may repeat reference numerals and/or letters in the various examples described herein. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (e.g., rotated 90 degrees or at other orientations) and the spatially relative descriptors used herein may be interpreted accordingly.

FIG. 1A is a perspective view of a semiconductor package device 1 in accordance with some embodiments of the present disclosure.

Referring to FIG. 1A, the semiconductor package device 1 includes a carrier 10, an electrode 11, an insulation layer 12, an electrode 13, a passivation layer 14, connection elements 15 and a patterned conductive layer 16.

The carrier 10 can include non-conductive material or insulation material. The carrier 10 may include, for example but is not limited to, glass, ceramics or other suitable materials.

The electrode 11 can include a conductive layer 111, a semiconductor wall 112 and conductive walls 113. The electrode 11 can include a comb or comb-like structure. Charge(s) or electrical charge(s) may be accumulated on the electrode 11.

The conductive layer 111 is disposed on the carrier 10. The conductive layer 111 may include a conductive material. The conductive layer 111 may include, for example but is not limited to, copper (Cu), aluminum (Al), silver (Ag), graphite, metal, alloy, non-metal conductive material, or other suitable conductive material(s). The conductive layer 111 may include a conductive plate.

The semiconductor wall 112 may be disposed or erected on the conductive layer 111. The semiconductor wall 112 may be directly disposed or erected on the conductive layer 111. The semiconductor wall 112 may be in direct contact with the conductive layer 111. The semiconductor wall 112 may be electrically connected to the conductive layer 111.

The semiconductor wall 112 may include semi-conductive material(s). The semiconductor wall 112 may include, for example but is not limited to, silicon, SiC, $Al_2O_3$ or other suitable material(s). The semiconductor wall 112 can include dopant. The semiconductor wall 112 can include n-type dopant or p-type dopant. The semiconductor wall 112 can include, for example but is not limited to, phosphorus (P) or other suitable material(s). The semiconductor wall 112 can include, for example but is not limited to, boron (B) or other suitable material(s).

The conductive wall 113 may be disposed or erected on the conductive layer 111. The conductive wall 113 may be directly disposed or erected on the conductive layer 111. The conductive wall 113 may be in direct contact with the conductive layer 111. The conductive wall 113 may be electrically connected to the conductive layer 111. The conductive wall 113 may be electrically connected to the semiconductor wall 112. The conductive wall 113 may be electrically connected to the semiconductor wall 112 through the conductive layer 111. The conductive wall 113 may include material similar or the same to the conductive layer 111. The conductive wall 113 may include material different from the conductive layer 111. The conductive wall 113 may include, for example but is not limited to, copper (Cu), aluminum (Al), silver (Ag), graphite, metal, alloy, non-metal conductive material, or other suitable conductive material(s).

The conductive wall 113 can be disposed substantially in parallel to the semiconductor wall 112. One conductive wall 113 can be disposed substantially in parallel to another conductive wall 113.

The insulation layer 12 may be disposed on the electrode 11. The insulation layer 12 may be disposed on the conductive layer 111. The insulation layer 12 can surround the semiconductor wall 112. The insulation layer 12 can surround the conductive wall 113. The insulation layer 12 can surround the electrode 13. The insulation layer 12 can surround the passivation layer 14. The insulation layer 12 can surround the connection element 15. The insulation layer 12 may be disposed between the semiconductor wall 112 and the conductive wall 113. The insulation layer 12 may be disposed between one conductive wall 113 and another conductive wall 113.

The insulation layer 12 may be disposed between the conductive wall 113 and the electrode 13. The insulation layer 12 may separate the electrode 11 from the electrode 13. The insulation layer 12 may include, for example but is not limited to, oxide, nitride, polyimide, CNF or other suitable material(s).

The electrode 13 can include a comb or comb-like structure. The electrode 13 may include a conductive plate 131 and some conductive walls 133 extended toward the conductive layer 111. The conductive wall 133 can be disposed substantially in parallel to the semiconductor wall 112. One conductive wall 133 can be disposed substantially in parallel to another conductive wall 133.

The electrode 13 may be disposed on the insulation layer 12. The electrode 13 may include, for example but is not limited to, copper (Cu), aluminum (Al), silver (Ag), graphite, metal, alloy, aluminum-copper alloy (AlCu), non-metal conductive material, or other suitable material(s). Charge(s) or electrical charge(s) may be accumulated on the electrode 13.

The passivation layer 14 may be disposed on the electrode 13. The passivation layer 14 may be disposed in direct contact with the semiconductor wall 112. The passivation layer 14 may be disposed in direct contact with the electrode 13. The passivation layer 14 can surround the electrode 13. The passivation layer 14 can surround the connection element 15.

The passivation layer 14 can cover the electrode 13. The electrode 13 can be disposed between the passivation layer 14 and the insulation layer 12. The passivation layer 14 may include, for example but is not limited to, polyimide, CNF, TiO, $Al_2O$, HfO, $BaTiO_3$, $Ta_2O_5$ or other suitable material(s).

The connection elements 15 can include a connection element 151 and a connection element 152.

The connection element 151 may be directly disposed on the semiconductor wall 112. The connection element 151 may be disposed in direct contact with the semiconductor wall 112. The connection element 151 may be electrically connected to the semiconductor wall 112.

The connection element 152 may be directly disposed on the electrode 13. The connection element 152 may be disposed in direct contact with the electrode 13. The connection element 152 may be electrically connected to the electrode 13. The connection element 151 can be separated from the connection element 152 by the passivation layer 14. The connection element 15 may include, for example but is not limited to, copper or other suitable material(s).

The patterned conductive layer 16 may include conductive trace(s), conductive pad(s), conductive land(s) or other circuitry element(s). The patterned conductive layer 16 may include a circuitry element 161 and another circuitry element 162.

The patterned conductive layer 16 may be disposed on the passivation layer 14. The patterned conductive layer 16 may be disposed on the connection element 15.

The circuitry element 161 may be directly disposed on the connection element 151. The circuitry element 161 may be disposed in direct contact with the connection element 151. The circuitry element 161 can be electrically connected to the connection element 151. The circuitry element 161 may provide or facilitate external connection.

The circuitry element 162 may be directly disposed on the connection element 152. The circuitry element 162 may be disposed in direct contact with the connection element 152. The circuitry element 162 can be electrically connected to the connection element 152. The circuitry element 162 may provide or facilitate external connection.

The patterned conductive layer 16 may include, for example but is not limited to, copper or other suitable material(s).

Figure 1B:
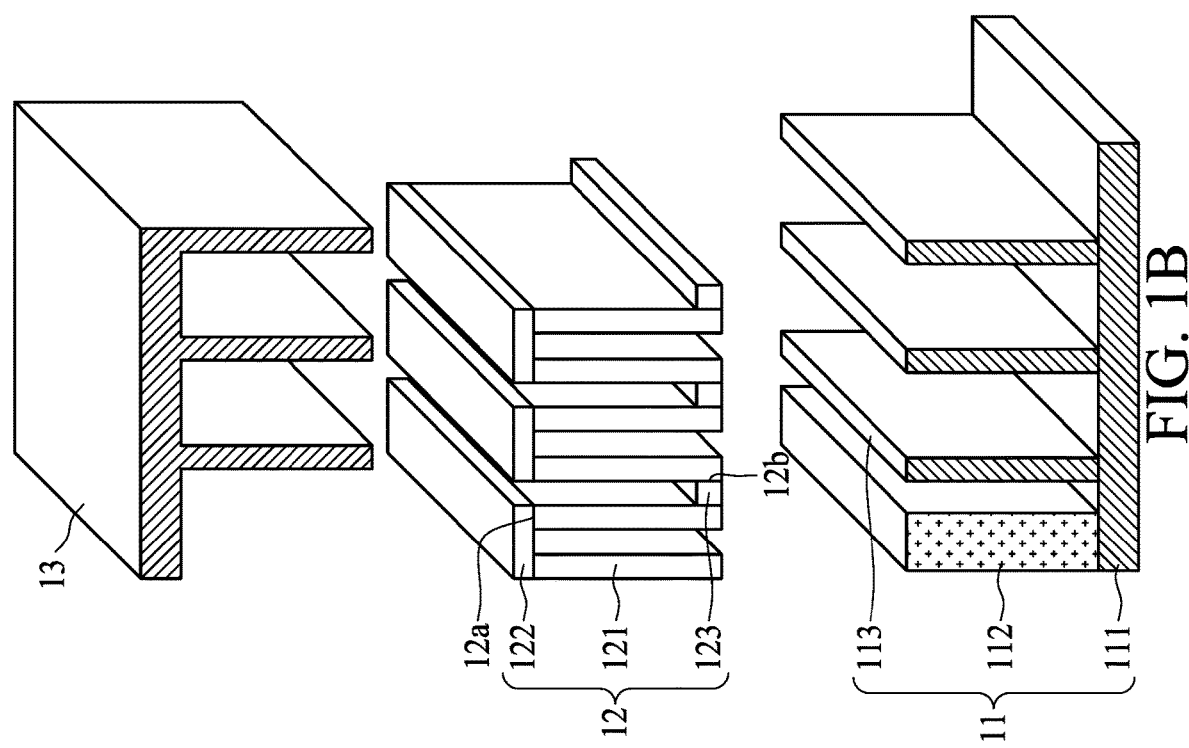
FIG. 1B is an exploded view of a portion of the semiconductor package device as shown in FIG. 1A in accordance with some embodiments of the present disclosure.

FIG. 1B is an exploded view of a portion of the semiconductor package device as device shown in FIG. 1A in accordance with some embodiments of the present disclosure.

Referring to FIG. 1B, the portion of the semiconductor package device includes the electrode 11, the insulation layer 12 and the electrode 13.

The electrode 11 may include the conductive layer 111, the semiconductor wall 112 and the conductive walls 113.

The insulation layer 12 may include portions 121, portions 122 and 123.

The portion 121 may be disposed between the semiconductor wall 112 and the conductive wall 113. The portion 121 may be disposed between the conductive wall 113 and the electrode 13.

The portion 122 may be directly disposed on the portion 121. The portions 122 may be directly disposed on the conductive walls 113. The portion 122 may separate the conductive walls 113 from the electrode 13. An interface (or a boundary) 12a may exist between the portion 122 and the portion 121.

The portions 123 may be directly disposed on the conductive layer 111. The portion 123 can separate the conductive layer 111 from the electrode 13. An interface (or a boundary) 12b may exist between the portion 123 and the portion 121.

Figure 1C:
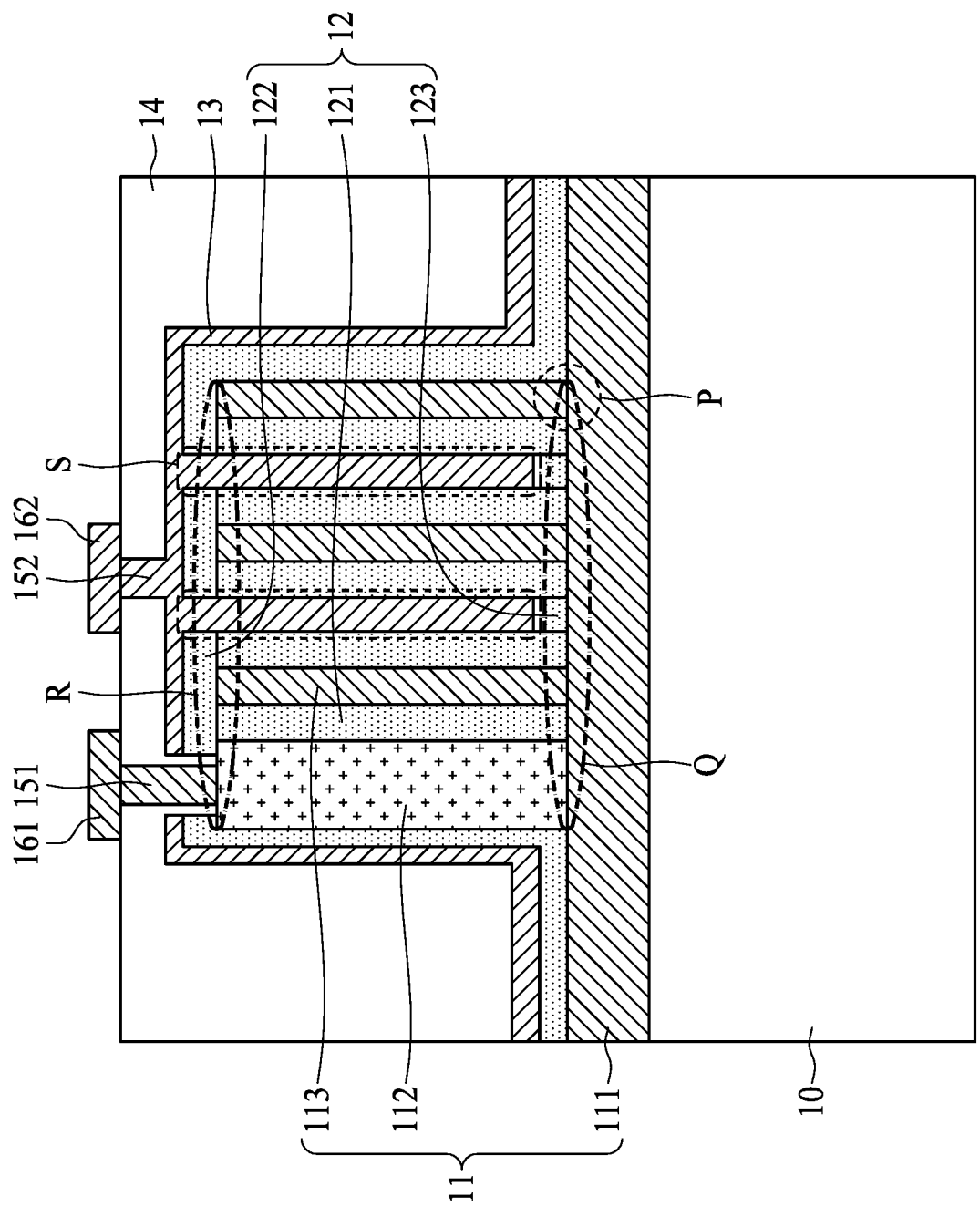
FIG. 1C is a cross-sectional view across line AA' of the semiconductor package device as shown in FIG. 1A in accordance with some embodiments of the present disclosure.

FIG. 1C is a cross-sectional view across line AA' of the semiconductor package device as shown in FIG. 1A in accordance with some embodiments of the present disclosure.

Figure 1D:
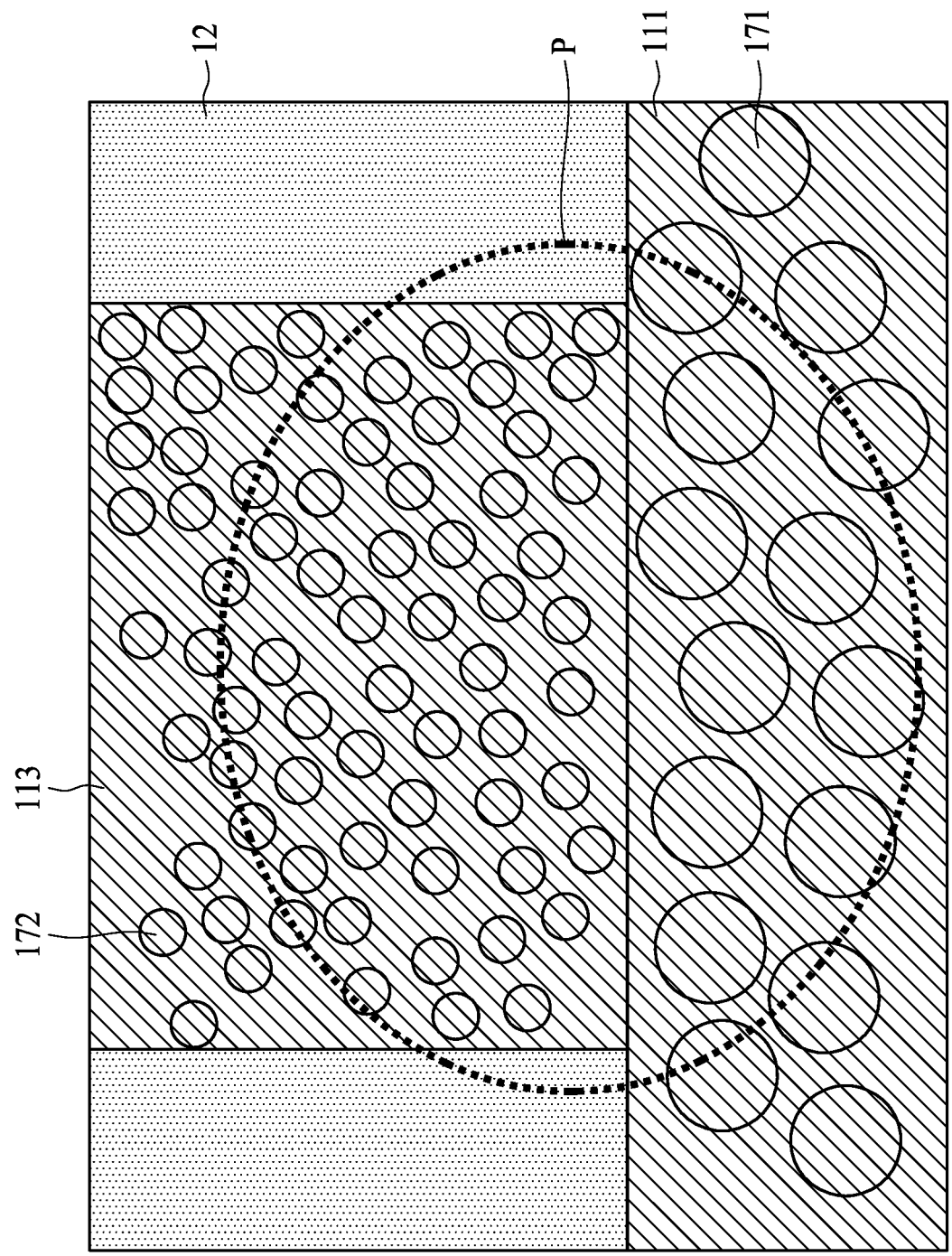
FIG. 1D is an enlarged view of structure in dotted circle P as shown in FIG. 1C in accordance with some embodiments of the present disclosure.

FIG. 1D is an enlarged view of structure in dotted circle P as shown in FIG. 1C in accordance with some embodiments of the present disclosure.

Referring to FIG. 1D, the conductive layer 111 may have grains 171 and the conductive wall 113 may have grains 172. The average size of the grain 171 may be different from the average size of the grain 172. The average size of the grain 171 may be greater than the average size of the grain 172. The average size of the grain 171 may be substantially identical or similar to the average size of the grain 172 in accordance with some other embodiments of the subject application.

Figure 1E:
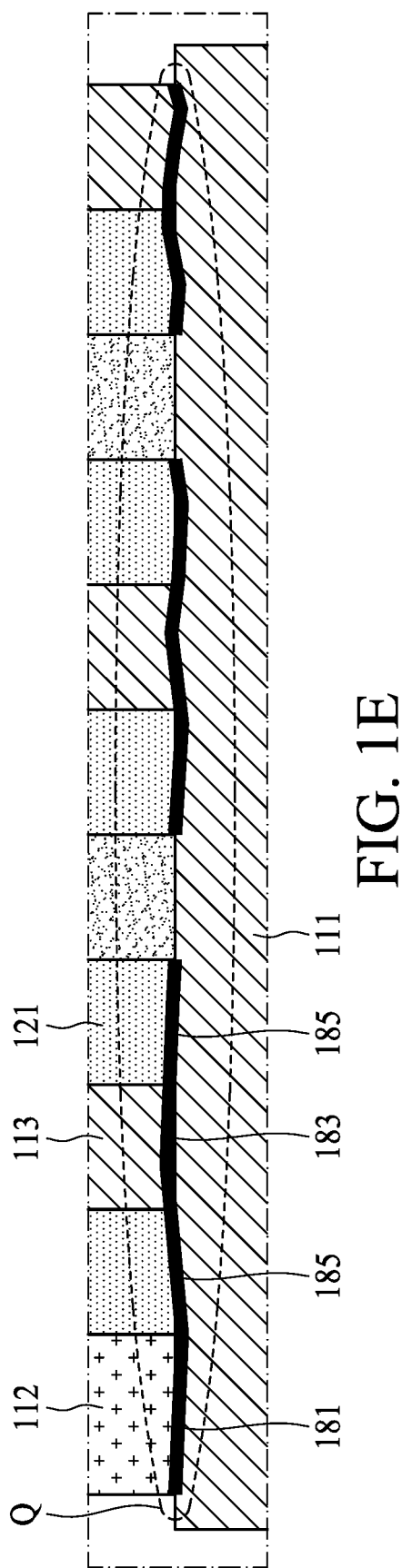
FIG. 1E is an enlarged view of structure in dotted circle Q of the semiconductor package device as shown in FIG. 1C in accordance with some embodiments of the present disclosure.

FIG. 1E is an enlarged view of structure in dotted circle Q of the semiconductor package device as shown in FIG. 1C in accordance with some embodiments of the present disclosure.

Referring to FIG. 1E, the structure in dotted circle Q, there is a boundary 181 or interface 181 between the semiconductor wall 112 and the conductive layer 111. There is a boundary 185 or interface 185 between the insulation layer 12 and the conductive layer 111. There is a boundary 185 or interface 185 between the portion 121 of the insulation layer 12 and the conductive layer 111. There is a boundary 183 or interface 183 between the conductive wall 113 and the conductive layer 111.

The boundary 181 or interface 181 may include a relatively uneven surface. The boundary 183 or interface 183 may include a relatively uneven surface. The boundary 185 or interface 185 may include a relatively uneven surface. The boundary 181 or interface 181 may include a relatively rough surface. The boundary 183 or interface 183 may include a relatively rough surface. The boundary 185 or interface 185 may include a relatively rough surface.

The boundary 181 or interface 181 may include a relatively even surface in accordance with some other embodiments of the subject application. The boundary 183 or interface 183 may include a relatively even surface in accordance with some other embodiments of the subject application. The boundary 185 or interface 185 may include a relatively even surface in accordance with some other embodiments of the subject application. The boundary 181 or interface 181 may include a relatively smooth surface. The boundary 183 or interface 183 may include a relatively smooth surface. The boundary 185 or interface 185 may include a relatively smooth surface.

Figure 1F:
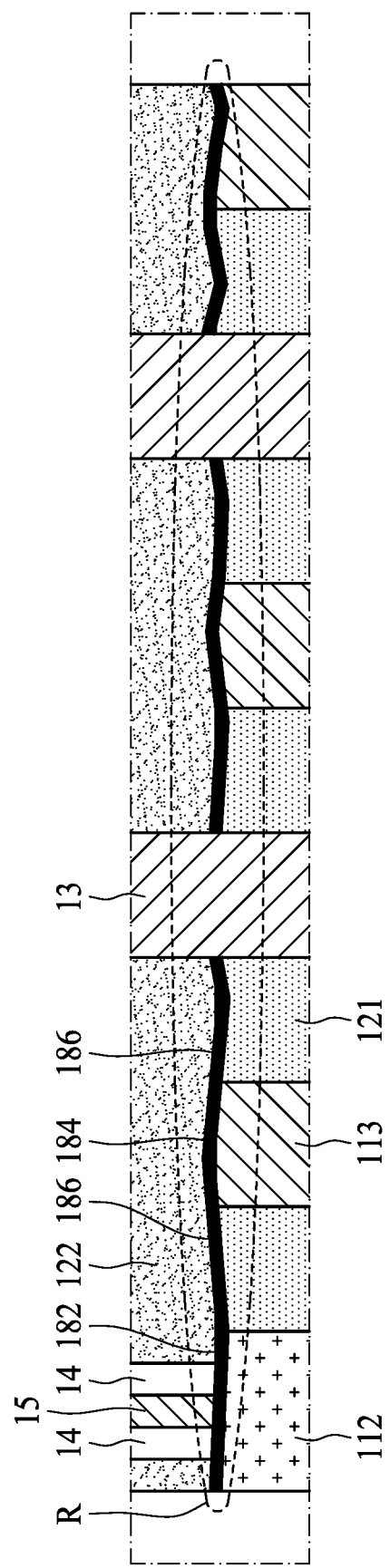
FIG. 1F is an enlarged view of structure in dotted circle R of the semiconductor package device as shown in FIG. 1C in accordance with some embodiments of the present disclosure.

FIG. 1F is an enlarged view of structure in dotted circle R of the semiconductor package device as shown in FIG. 1C in accordance with some embodiments of the present disclosure.

Referring to FIG. 1F, the structure in dotted circle R, there is a boundary 182 or interface 182 between the semiconductor wall 112 and the portion 122 of the insulation layer 12, the passivation layer 14, and the connection element 15. There is a boundary 186 or interface 186 between the portion 121 of the insulation layer 12 and the portion 122 of the insulation layer 12. There is a boundary 184 or interface 184 between the conductive wall 113 and the portion 122 of the insulation layer 12.

The boundary 182 or interface 182 may include a relatively uneven surface. The boundary 184 or interface 184 may include a relatively uneven surface. The boundary 186 or interface 186 may include a relatively uneven surface. The boundary 182 or interface 182 may include a relatively rough surface. The boundary 184 or interface 184 may include a relatively rough surface. The boundary 186 or interface 186 may include a relatively rough surface.

The boundary 182 or interface 182 may include a relatively even surface in accordance with some other embodiments of the subject application. The boundary 184 or interface 184 may include a relatively even surface in accordance with some other embodiments of the subject application. The boundary 186 or interface 186 may include a relatively even surface in accordance with some other embodiments of the subject application. The boundary 182 or interface 182 may include a relatively smooth surface. The boundary 184 or interface 184 may include a relatively smooth surface. The boundary 186 or interface 186 may include a relatively smooth surface.

Figure 1G:
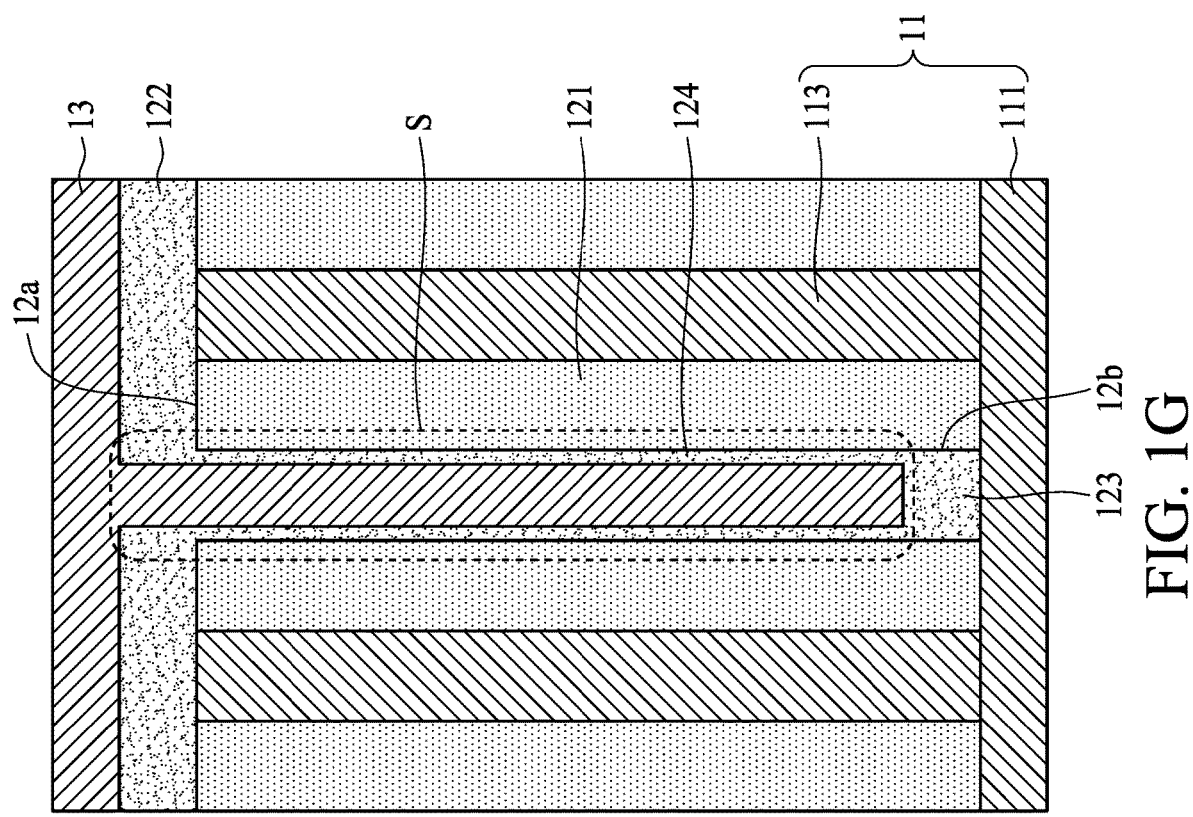
FIG. 1G is an enlarged view of structure in dotted circle S as shown in FIG. 1C in accordance with some embodiments of the present disclosure.

FIG. 1G is an enlarged view of structure in dotted circle S of the semiconductor package device as shown in FIG. 1C in accordance with some embodiments of the present disclosure.

Referring to FIG. 1G, the insulation layer 12 may include another portion 124. The portion 124 may be disposed on the portion 121. The portion 124 may be disposed on the electrode 13. The portion 124 may be disposed between the portion 121 and the electrode 13. The portion 124 may be extended from the portion 122 to the portion 123. The portion 124 can connect the portion 122 and the portion 123. The portion 124 may include a relatively uniform thickness.

The portion 121 may include material same or similar to the portion 122. The portion 121 may include material same or similar to the portion 123. The portion 121 may include material same or similar to the portion 124. The portion 122 may include material same or similar to the portion 123. The portion 122 may include material same or similar to the portion 124. The portion 123 may include material same or similar to the portion 124.

The portion 121 may include material different from the portion 122 in accordance with some other embodiments of the subject application. The portion 121 may include material different from the portion 123 in accordance with some other embodiments of the subject application. The portion 121 may include material different from the portion 124 in accordance with some other embodiments of the subject application. The portion 122 may include material different from the portion 123 in accordance with some other embodiments of the subject application. The portion 122 may include material different from the portion 124 in accordance with some other embodiments of the subject application. The portion 123 may include material different from the portion 124 in accordance with some other embodiments of the subject application.

Figure 1H:
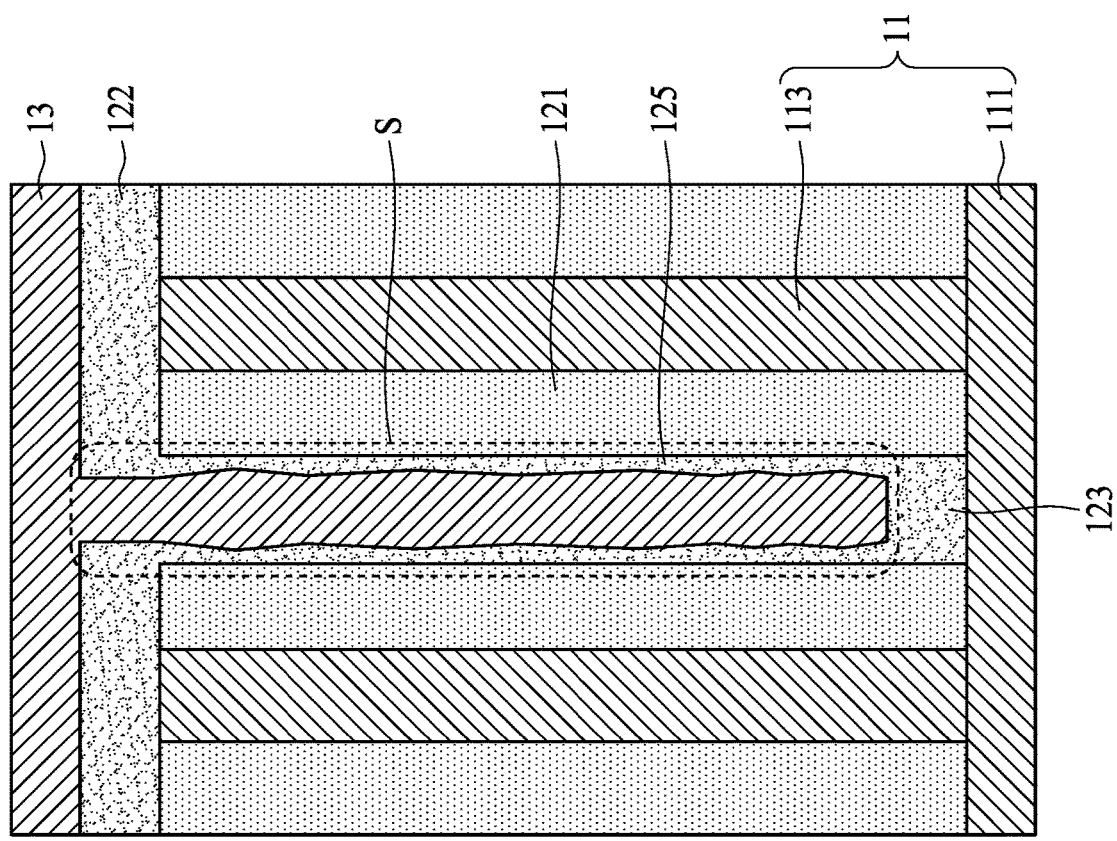
FIG. 1H is an enlarged view of structure in dotted circle S as shown in FIG. 1C in accordance with some embodiments of the present disclosure.

FIG. 1H is an enlarged view of structure in dotted circle S of the semiconductor package device as shown in FIG. 1C in accordance with some embodiments of the present disclosure.

Referring to FIG. 1H, the insulation layer 12 may include another portion 125. The portion 125 may be disposed on the portion 121. The portion 125 may be disposed on the electrode 13. The portion 125 may be disposed between the portion 121 and the electrode 13. The portion 125 may be extended from the portion 122 to the portion 123. The portion 125 can connect the portion 122 and the portion 123. The portion 125 may include a varied or uneven thickness. The portion 125 may include a relatively uneven or rough boundary to the electrode 13. The portion 125 may include a relatively uneven or rough interface to the electrode 13. The portion 125 may include a relatively even or smooth boundary to the portion 121. The portion 125 may include a relatively even or smooth interface to the portion 121.

The portion 121 may include material same or similar to the portion 122. The portion 121 may include material same or similar to the portion 123. The portion 121 may include material same or similar to the portion 125. The portion 122 may include material same or similar to the portion 123. The portion 122 may include material same or similar to the portion 125. The portion 123 may include material same or similar to the portion 125.

The portion 121 may include material different from the portion 122 in accordance with some other embodiments of the subject application. The portion 121 may include material different from the portion 123 in accordance with some other embodiments of the subject application. The portion 121 may include material different from the portion 125 in accordance with some other embodiments of the subject application. The portion 122 may include material different from the portion 123 in accordance with some other embodiments of the subject application. The portion 122 may include material different from the portion 125 in accordance with some other embodiments of the subject application. The portion 123 may include material different from the portion 125 in accordance with some other embodiments of the subject application.

Figure 1I:
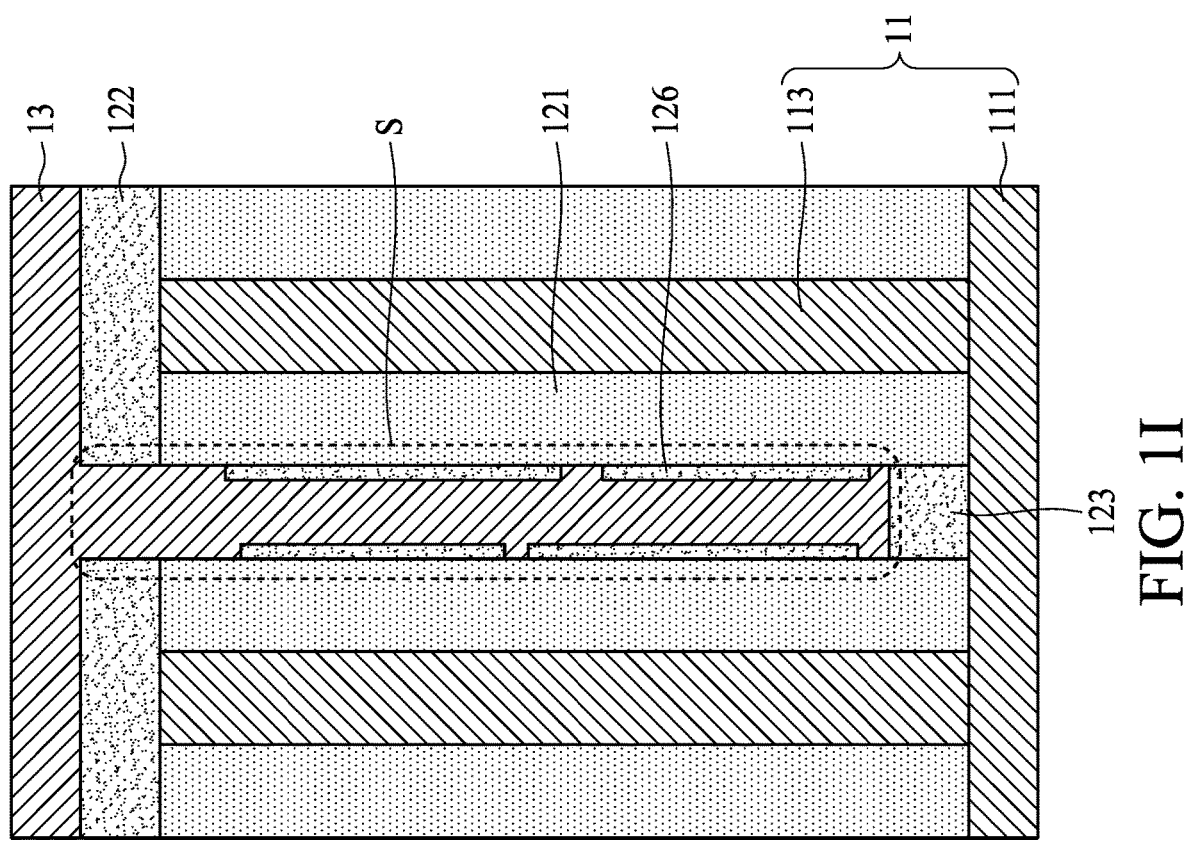
FIG. 1I is an enlarged view of structure in dotted circle S as shown in FIG. 1C in accordance with some embodiments of the present disclosure.

FIG. 1I is an enlarged view of structure in dotted circle S of the semiconductor package device as shown in FIG. 1C in accordance with some embodiments of the present disclosure.

Referring to FIG. 1I, the insulation layer 12 may include another portion 126. The portion 126 may be disposed on the portion 121. The portion 126 may be disposed on the electrode 13. The portion 126 may be disposed between the portion 121 and the electrode 13. The portion 126 can include a relatively thin layer having a recess or opening. The portion 126 can include a relatively thin layer having a recess or opening to expose the portion 121. The portion 126 can include a relatively thin layer having recesses or openings. The portion 126 can include a relatively thin layer having recesses or openings to expose the portion 121. The portion 126 may be extended from the portion 122. The portion 126 may be extended from the portion 123. The portion 126 can be connected to the portion 122. The portion 126 can be connected to the portion 123. The portion 126 can be disconnected from the portion 122. The portion 126 can be disconnected from the portion 123.

The portion 121 may include material same or similar to the portion 122. The portion 121 may include material same or similar to the portion 123. The portion 121 may include material same or similar to the portion 126. The portion 122 may include material same or similar to the portion 123. The portion 122 may include material same or similar to the portion 126. The portion 123 may include material same or similar to the portion 126.

The portion 121 may include material different from the portion 122 in accordance with some other embodiments of the subject application. The portion 121 may include material different from the portion 123 in accordance with some other embodiments of the subject application. The portion 121 may include material different from the portion 126 in accordance with some other embodiments of the subject application. The portion 122 may include material different from the portion 123 in accordance with some other embodiments of the subject application. The portion 122 may include material different from the portion 126 in accordance with some other embodiments of the subject application. The portion 123 may include material different from the portion 126 in accordance with some other embodiments of the subject application.

Figure 1J:
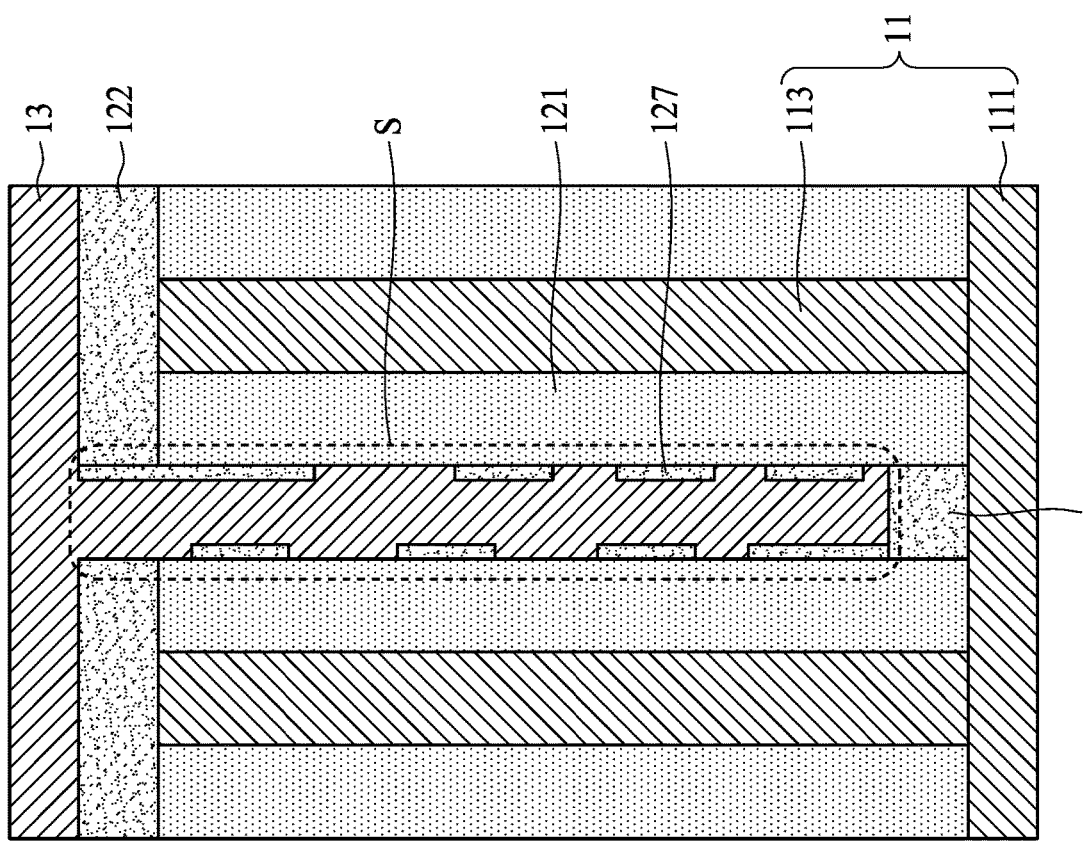
FIG. 1J is an enlarged view of structure in dotted circle S as shown in FIG. 1C in accordance with some embodiments of the present disclosure.

FIG. 1J is an enlarged view of structure in dotted circle S of the semiconductor package device as shown in FIG. 1C in accordance with some embodiments of the present disclosure.

Referring to FIG. 1J, the insulation layer 12 may include another portion 127. The portion 127 may be disposed on the portion 121. The portion 127 may be disposed on the electrode 13. The portion 127 may be disposed between the portion 121 and the electrode 13. The portion 127 can include some islands or pads. The portion 127 can include some islands or pads which expose the portion 121. The portion 127 may be extended from the portion 122. The portion 127 may be extended from the portion 123. The portion 127 can be connected to the portion 122. The portion 127 can be connected to the portion 123. The portion 127 can be disconnected from the portion 122. The portion 127 can be disconnected from the portion 123.

The portion 121 may include material same or similar to the portion 122. The portion 121 may include material same or similar to the portion 123. The portion 121 may include material same or similar to the portion 127. The portion 122 may include material same or similar to the portion 123. The portion 122 may include material same or similar to the portion 127. The portion 123 may include material same or similar to the portion 127.

The portion 121 may include material different from the portion 122 in accordance with some other embodiments of the subject application. The portion 121 may include material different from the portion 123 in accordance with some other embodiments of the subject application. The portion 121 may include material different from the portion 127 in accordance with some other embodiments of the subject application. The portion 122 may include material different from the portion 123 in accordance with some other embodiments of the subject application. The portion 122 may include material different from the portion 127 in accordance with some other embodiments of the subject application. The portion 123 may include material different from the portion 127 in accordance with some other embodiments of the subject application.

Figure 1K:
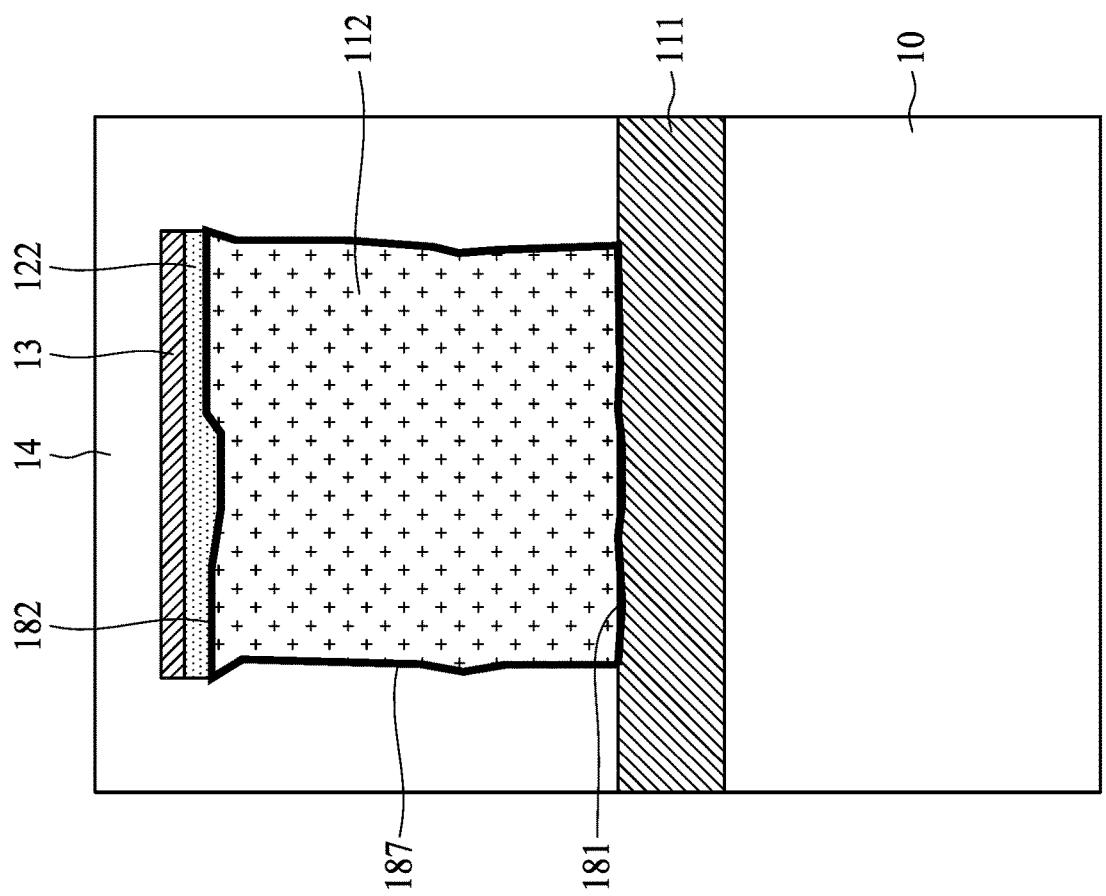
FIG. 1K is a cross-sectional view across line BB' of the semiconductor package device as shown in FIG. 1A in accordance with some embodiments of the present disclosure.

FIG. 1K is a cross-sectional view across line BB' of the semiconductor package device as shown in FIG. 1A in accordance with some embodiments of the present disclosure.

Referring to FIG. 1K, the conductive layer 111 can be disposed on the carrier 10. The semiconductor wall 112 can be directly disposed on the conductive layer 111. The semiconductor wall 112 may be covered by the portion 122. The portion 122 may be covered by the electrode 13. The passivation layer 14 may surround the semiconductor wall 112. The passivation layer 14 may surround the portion 122. The passivation layer 14 may surround the electrode 13. The passivation layer 14 may cover the conductive layer 111.

Also referring to FIG. 1K, the semiconductor wall 112 may include a relatively uneven or rough surface. The boundary 181 or interface 181 between the semiconductor wall 112 and the conductive layer 111 may include a relatively uneven or rough surface. The boundary 182 or interface 182 between the semiconductor wall 112 and the portion 122 of the insulation layer 12 may include a relatively uneven or rough surface. The boundary 187 or interface 187 between the semiconductor wall 112 and the passivation layer 14 may include a relatively uneven or rough surface.

The boundary 181 or interface 181 may include a relatively even or smooth surface in accordance with some other embodiments of the subject application. The boundary 183 or interface 183 may include a relatively even or smooth surface in accordance with some other embodiments of the subject application. The boundary 187 or interface 187 may include a relatively even or smooth surface in accordance with some other embodiments of the subject application.

Figure 1L:
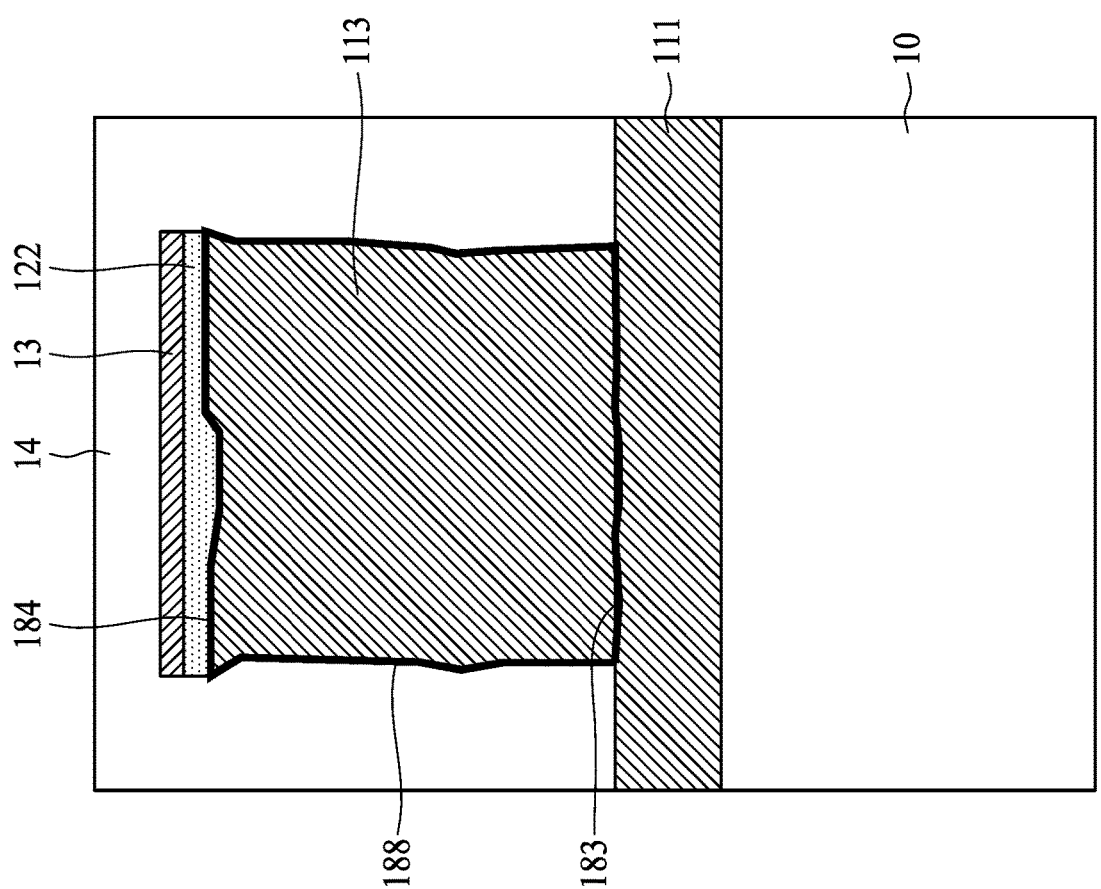
FIG. 1L is a cross-sectional view across line CC' of the semiconductor package device as shown in FIG. 1A in accordance with some embodiments of the present disclosure.

FIG. 1L is a cross-sectional view across line CC' of the semiconductor package device as shown in FIG. 1A in accordance with some embodiments of the present disclosure.

Referring to FIG. 1L, the conductive layer 111 can be disposed on the carrier 10. The conductive wall 113 can be directly disposed on the conductive layer 111. The conductive wall 113 may be covered by the portion 122. The portion 122 may be covered by the electrode 13. The passivation layer 14 may surround the conductive wall 113. The passivation layer 14 may surround the portion 122. The passivation layer 14 may surround the electrode 13. The passivation layer 14 may cover the conductive layer 111.

Also referring to FIG. 1L, the conductive wall 113 may include a relatively uneven or rough surface. The boundary 183 or interface 183 between the conductive wall 113 and the conductive layer 111 may include a relatively uneven or rough surface. The boundary 184 or interface 184 between the conductive wall 113 and the portion 122 of the insulation layer 12 may include a relatively uneven or rough surface. The boundary 188 or interface 188 between the conductive wall 113 and the passivation layer 14 may include a relatively uneven or rough surface.

The boundary 183 or interface 183 may include a relatively even or smooth surface in accordance with some other embodiments of the subject application. The boundary 184 or interface 184 may include a relatively even or smooth surface in accordance with some other embodiments of the subject application. The boundary 188 or interface 188 may include a relatively even or smooth surface in accordance with some other embodiments of the subject application.

Figure 1M:
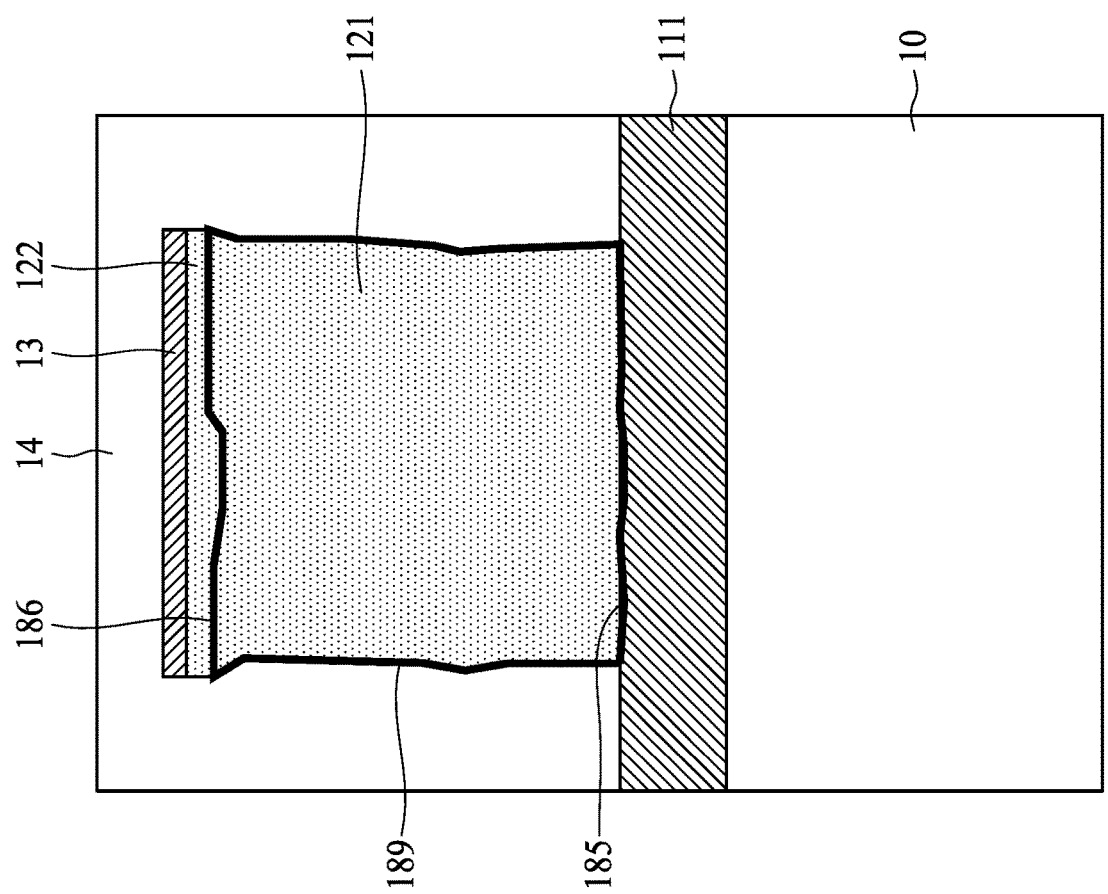
FIG. 1M is a cross-sectional view across line DD' of the semiconductor package device as shown in FIG. 1A in accordance with some embodiments of the present disclosure.

FIG. 1M is a cross-sectional view across line DD' of the semiconductor package device as shown in FIG. 1A in accordance with some embodiments of the present disclosure.

Referring to FIG. 1M, the conductive layer 111 can be disposed on the carrier 10. The portion 121 can be directly disposed on the conductive layer 111. The portion 121 may be covered by the portion 122. The portion 122 may be covered by the electrode 13. The passivation layer 14 may surround the portion 121. The passivation layer 14 may surround the portion 122. The passivation layer 14 may surround the electrode 13. The passivation layer 14 may cover the conductive layer 111.

Also referring to FIG. 1M, the portion 121 of the insulation layer 12 may include a relatively uneven or rough surface. The boundary 185 or interface 185 between the portion 121 of the insulation layer 12 and the conductive layer 111 may include a relatively uneven or rough surface. The boundary 186 or interface 186 between the portion 121 of the insulation layer 12 and the portion 122 of the insulation layer 12 may include a relatively uneven or rough surface. The boundary 189 or interface 189 between the portion 121 of the insulation layer 12 and the passivation layer 14 may include a relatively uneven or rough surface.

The boundary 185 or interface 185 may include a relatively even or smooth surface in accordance with some other embodiments of the subject application. The boundary 186 or interface 186 may include a relatively even or smooth surface in accordance with some other embodiments of the subject application. The boundary 189 or interface 189 may include a relatively even or smooth surface in accordance with some other embodiments of the subject application.

FIG. 2A through FIG. 2I illustrate a method for manufacturing a semiconductor package device in accordance with some embodiments.

Figure 2A:
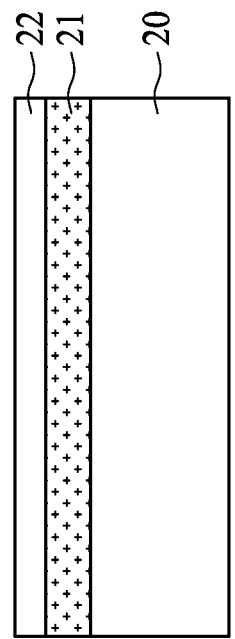
FIG. 2A, FIG. 2B, FIG. 2C, FIG. 2D, FIG. 2E, FIG. 2F, FIG. 2G, FIG. 2H and FIG. 2I illustrate a method for manufacturing a semiconductor package device in accordance with some embodiments of the present disclosure.

Referring to FIG. 2A, a semiconductor substrate 20 is provided. The semiconductor substrate 20 may include, for example but is not limited to, silicon (Si) or other suitable semi-conductive materials.

A semiconductor layer or region 21 may be formed on the semiconductor substrate 20. A semiconductor layer or region 21 may be formed in the semiconductor substrate 20. The semiconductor layer or region 21 may include an extrinsic semiconductor layer or region. The semiconductor layer or region 21 may be formed by, for example, ion implantation, deposition or other suitable technique(s).

The semiconductor layer or region 21 may include dopants. The dopants may include n-type dopants. The n-type dopants of the semiconductor layer or region 21 may include, for example but is not limited to, phosphorus, or other suitable materials. The dopants may include p-type dopants. The p-type dopants of the semiconductor layer or region 21 may include, for example but is not limited to, boron, or other suitable materials.

Figure 2B:
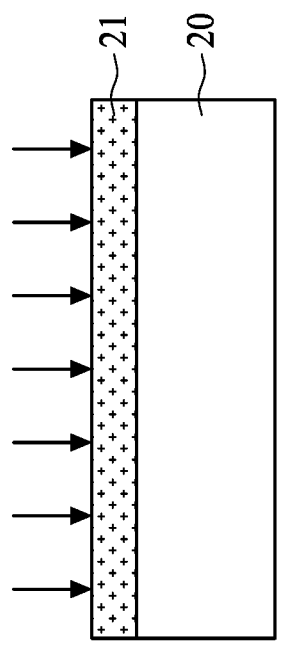

Referring to FIG. 2B, an insulation layer 22 may be provided on the semiconductor layer or region 21. The insulation layer 22 may be formed by chemical vapor deposition (CVD), physical vapor deposition (PVD), or other suitable technique(s). The insulation layer 22 may be electrically insulative. The insulation layer 22 may include, for example, oxide, nitride, or other suitable materials.

Figure 2C:
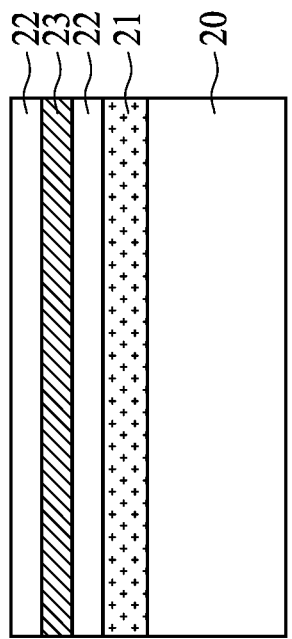

Referring to FIG. 2C, a conductive layer 23 may be provided or formed on the insulation layer 22. The conductive layer 23 may be formed on the insulation layer 22 by CVD, PVD, or other suitable technique(s). The conductive layer 23 may be electrically conductive. The conductive layer 23 may include, for example but is not limited to, copper, an aluminum-copper alloy, or other metal or metal alloy.

Figure 2D:
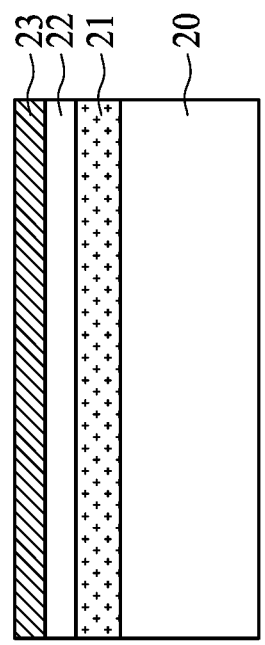

Referring to FIG. 2D, another insulation layer 22 may be provided or formed on the conductive layer 23. The insulation layer 22 may be formed on the conductive layer 23 by CVD, PVD, or other suitable technique(s). The insulation layer 22 may include, for example but is not limited to, oxide, nitride, or other suitable material(s).

Figure 2E:
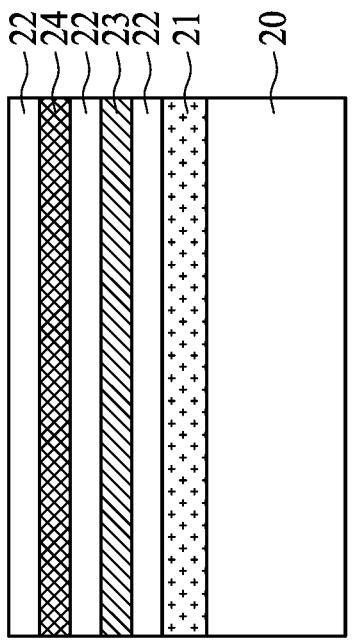

Referring to FIG. 2E, an insulation layer 24 may be provided or formed on the insulation layer 22. The insulation layer 24 may be formed on the insulation layer 22 by CVD, PVD, or other suitable technique(s). The insulation layer 24 may include, for example but is not limited to, nitride, oxide, or other suitable material(s). The material of the insulation layer 24 can be different from the material of the insulation layer 22.

Figure 2F:
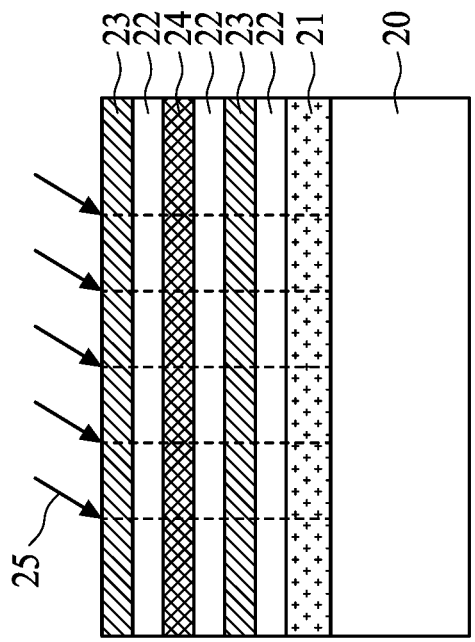

Referring to FIG. 2F, another insulation layer 22 may be provided or formed on the insulation layer 24. The insulation layer 22 may be formed on the insulation layer 24 by CVD, PVD, or other suitable technique(s). The insulation layer 22 may include, for example but is not limited to, oxide, nitride, or other suitable material(s).

Although it is not illustrated in FIG. 2F, it is contemplated that the operations as described and illustrated with reference to FIG. 2C, FIG. 2D, FIG. 2E and FIG. 2F may be repeatedly performed. For example, the operations as described and illustrated with reference to FIG. 2C, FIG. 2D, FIG. 2E and FIG. 2F can be repeatedly performed 1 to 50 times or even more. For example, the operations as described and illustrated with reference to FIG. 2C, FIG. 2D, FIG. 2E and FIG. 2F can be repeatedly performed 1 to 50 times or even less. For example, the operations as described and illustrated with reference to FIG. 2C, FIG. 2D, FIG. 2E and FIG. 2F can be repeatedly performed 10 to 30 times or even more. For example, the operations as described and illustrated with reference to FIG. 2C, FIG. 2D, FIG. 2E and FIG. 2F can be repeatedly performed 10 to 30 times or even less. For example, the operations as described and illustrated with reference to FIG. 2C, FIG. 2D, FIG. 2E and FIG. 2F can be repeatedly performed 24 to 26 times or even more. For example, the operations as described and illustrated with reference to FIG. 2C, FIG. 2D, FIG. 2E and FIG. 2F can be repeatedly performed 24 to 26 times or even less.

Figure 2G:
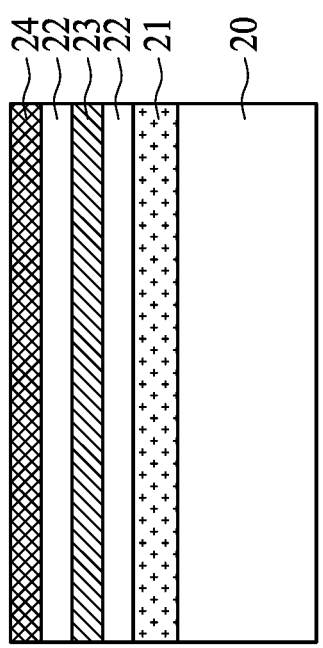

Referring to FIG. 2G, another conductive layer 23 may be provided or formed on said yet another insulation layer 22. The conductive layer 23 may be formed on the insulation layer 22 by CVD, PVD, or other suitable fabrication technique(s). The conductive layer 23 may be electrically conductive. The conductive layer 23 may include, for example but is not limited to, copper, an aluminum-copper alloy, or other metal or metal alloy.

Figure 2H:
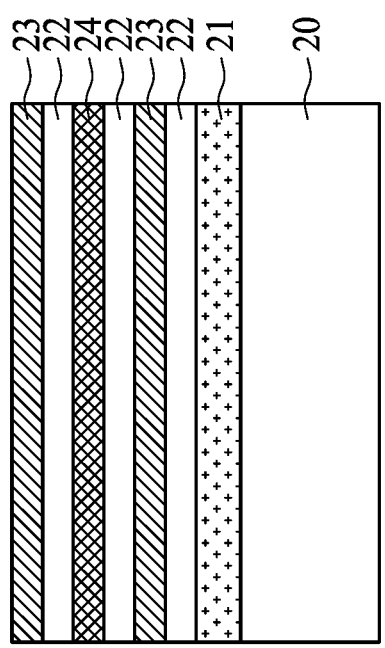

Referring to FIG. 2H, a sawing operation 25 may be performed to the structure as shown in FIG. 2G. The sawing operation 25 may be performed along scribe lines (as shown by dotted lines). The sawing operation 25 may be performed on the stacked structure on the substrate 20, which may include layers 21, 22, 23 and 24. In accordance with some other embodiments of the subject application. The sawing operation 25 may separate or divide the structure as shown in FIG. 2G into some units.

Figure 2I:
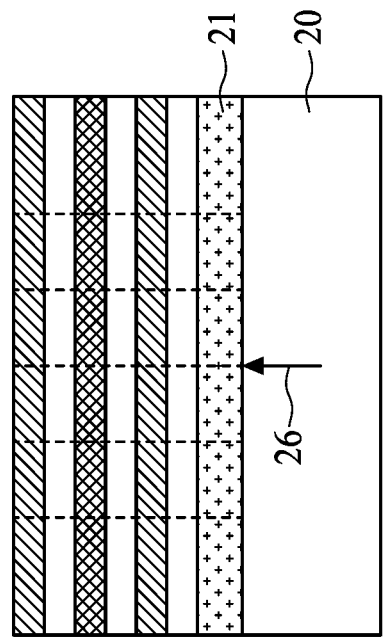

Referring to FIG. 2I, a grinding operation 26 may be performed on a surface of the semiconductor substrate 20. The grinding operation 26 may be performed on the surface of the semiconductor substrate 20 opposite the semiconductor layer 21. The grinding operation 26 may be performed to separate or divide the structure as shown in FIG. 2H into some units.

Figure 3A:
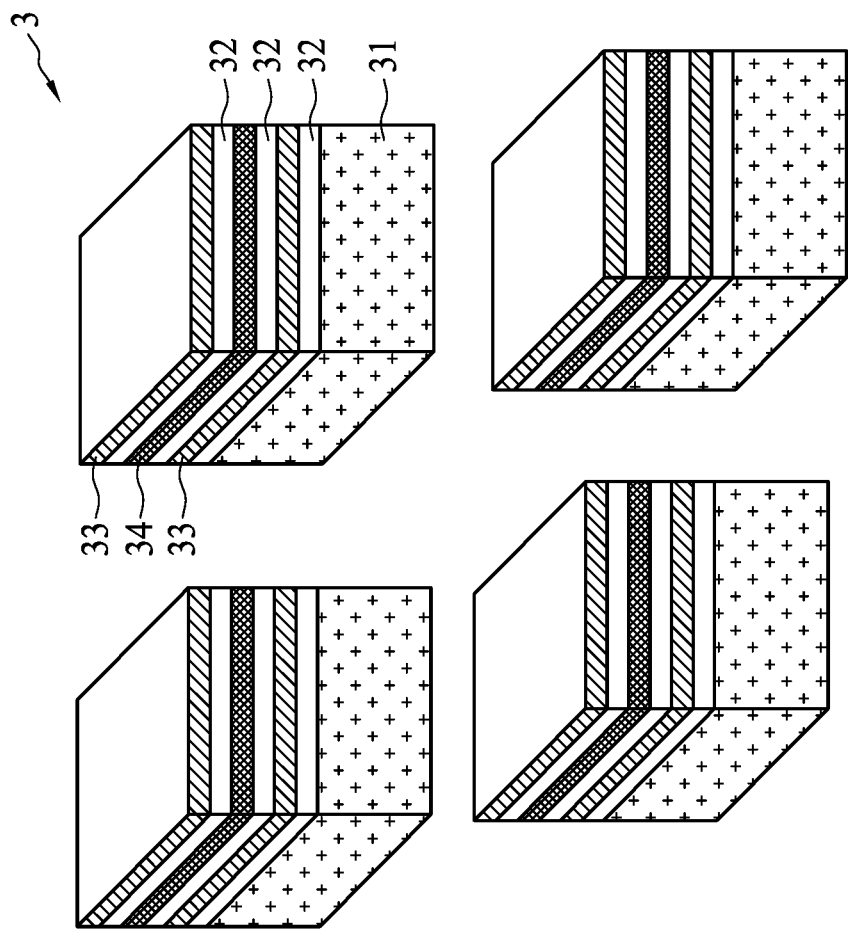
FIG. 3A schematically depicts some units in accordance with some embodiments of the present disclosure.
Figure 3B:
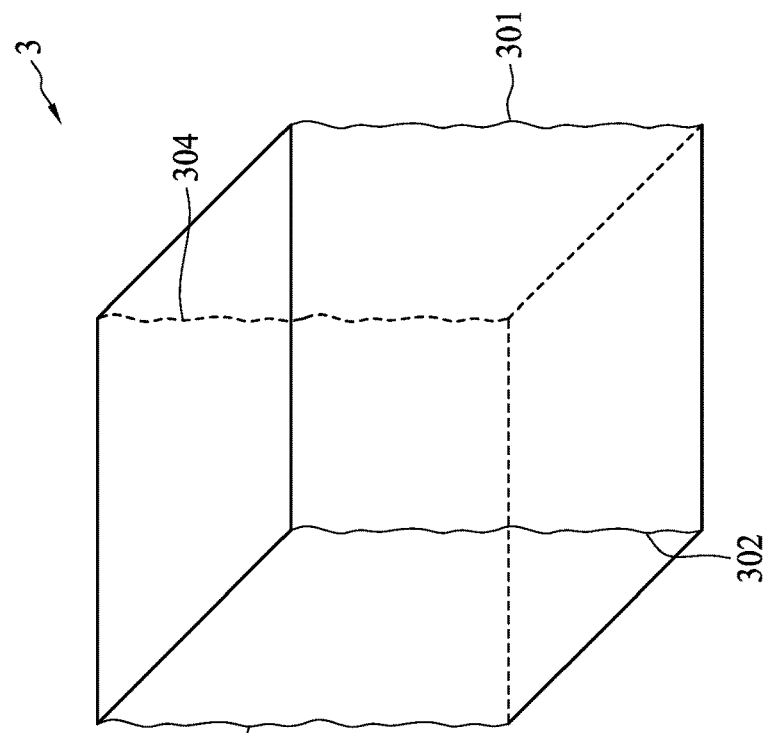
FIG. 3B is a schematically enlarged and perspective view of a unit as shown in FIG. 3A in accordance with some embodiments of the present disclosure.
Figure 3B:
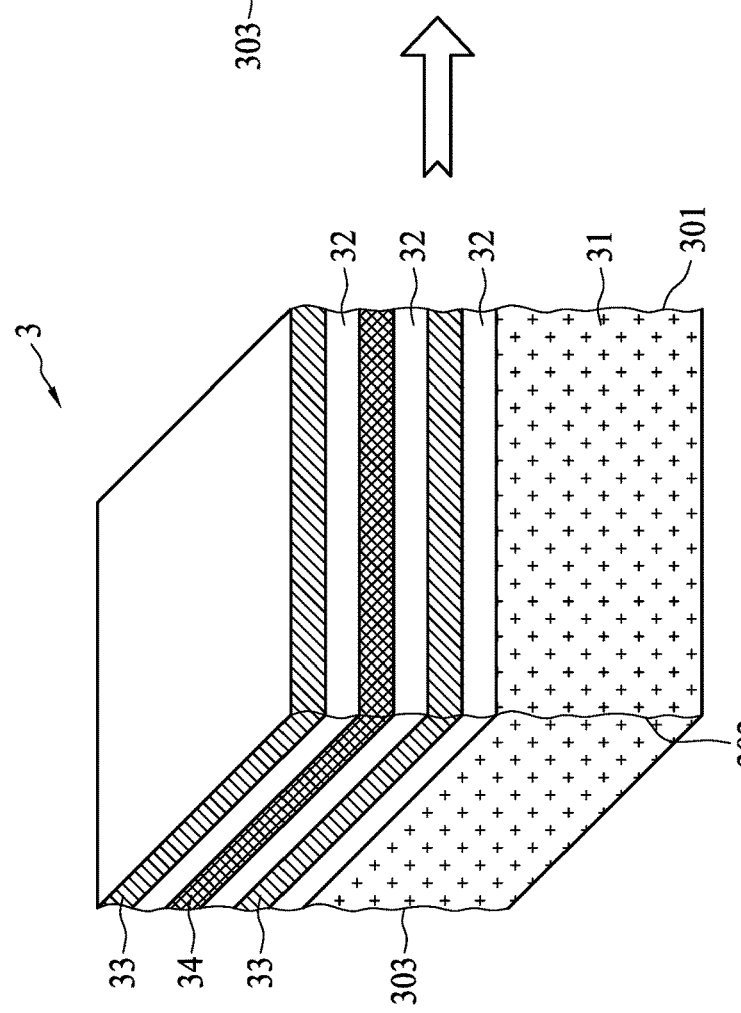

FIGS. 3A and 3B schematically depict some units formed by the operations illustrated in FIG. 2A through FIG. 2I in accordance with some embodiments of the present disclosure.

Referring to FIG. 3A, some units 3 are formed. Each unit 3 may include a semiconductor layer or region 31 with a stacking layer thereon. The semiconductor layer or region 31 may include dopants. The dopants may include n-type dopants. The n-type dopants of the semiconductor layer or region 31 may include, for example but is not limited to, phosphorus, or other suitable materials. The dopants may include p-type dopants. The p-type dopants of the semiconductor layer or region 31 may include, for example but is not limited to, boron, or other suitable materials. The stacking layer may include insulation layers 32, conductive layers 33 and insulation layers 34. Alternatively, each unit 3 may further include a semiconductor layer (not shown) without dopants beneath the semiconductor layer or region 31.

Also referring to FIG. 3A, the unit 3 may be a cuboid. Alternatively, the unit 3 may be a cube.

FIG. 3B is a schematically enlarged and perspective view of a unit as shown in FIG. 3A in accordance with some embodiments of the present disclosure.

Referring to FIG. 3B, the unit 3 may have an uneven surface between side 301 and side 302. Alternatively, after a planarization operation is performed, the unit 3 may have an even surface between side 301 and side 302.

Also referring to FIG. 3B, the unit 3 may have an uneven surface between side 302 and side 303. Alternatively, after a planarization operation is performed, the unit 3 may have an even surface between side 302 and side 303.

Also referring to FIG. 3B, the unit 3 may have an uneven surface between side 303 and side 304. Alternatively, after a planarization operation is performed, the unit 3 may have an even surface between side 303 and side 304.

Also referring to FIG. 3B, the unit 3 may have an uneven surface between side 301 and side 304. Alternatively, after a planarization operation is performed, the unit 3 may have an even surface between side 301 and side 304.

Figure 4B:
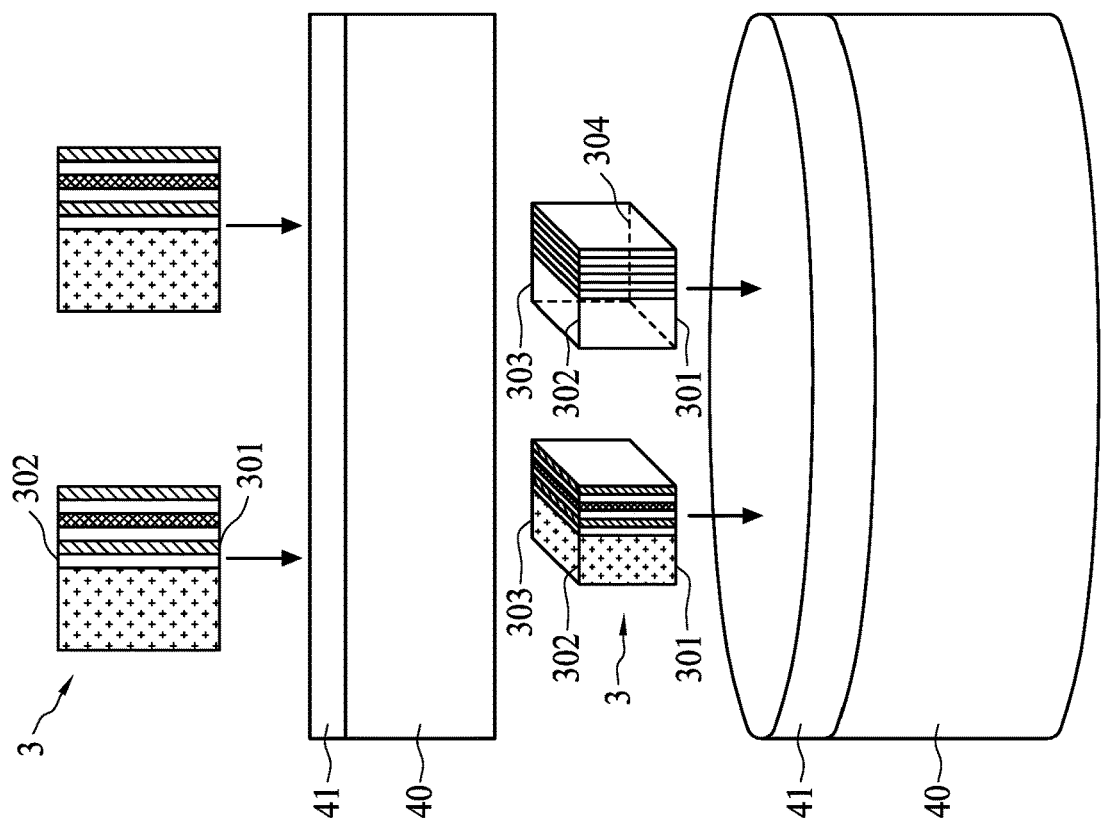
FIG. 4A and FIG. 4B schematically illustrate a method for forming a semiconductor package device in accordance with some embodiments of the present disclosure.
Figure 4A:
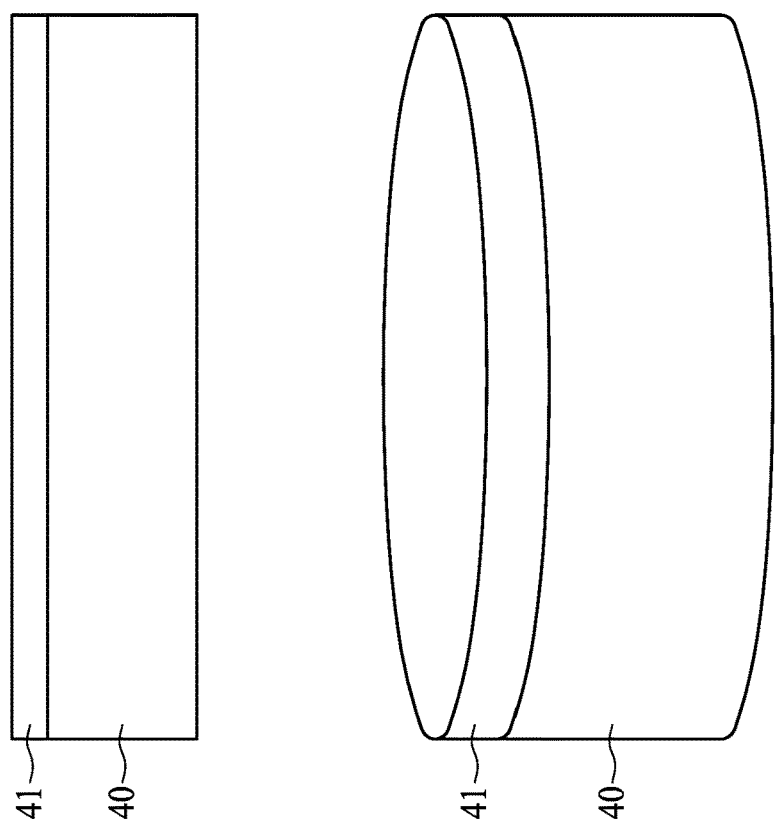

FIG. 4A and FIG. 4B schematically illustrate a method for forming a semiconductor package device in accordance with some embodiments of the present disclosure.

Referring to FIG. 4A, a carrier 40 is provided. The carrier 40 may include an insulative material. The carrier 40 may include, for example but is not limited to, a glass or other suitable materials.

Also referring to FIG. 4A, a conductive layer 41 can be provided on an upper surface of the carrier 40. The conductive layer 41 may be formed on the upper surface of the carrier 40 by, for example but is not limited to, plating, sputtering, deposition or other suitable fabrication process. The conductive layer 41 may include a conductive material. The conductive layer 41 may be, for example but is not limited to, copper (Cu), aluminum (Al), silver (Ag), graphite, metal, alloy, non-metal conductive material, or other suitable conductive material(s).

Referring to FIG. 4B, a unit 3 as shown in FIG. 3A or FIG. 3B can be provided on the conductive layer 41. The surface between side 301 and side 304 of the unit 3 may be bonded to the conductive layer 41. The surface between side 301 and side 304 of the unit 3 may be uneven. Alternatively, the surface between side 301 and side 304 of the unit 3 may be even.

Also referring to FIG. 4B, the surface between side 301 and side 302 of the unit 3 may be bonded to the conductive layer 41. The surface between side 301 and side 302 of the unit 3 may be uneven. Alternatively, the surface between side 301 and side 302 of the unit 3 may be even.

Also referring to FIG. 4B, the surface between side 302 and side 303 of the unit 3 may be bonded to the conductive layer 41. The surface between side 302 and side 303 of the unit 3 may be uneven. Alternatively, the surface between side 302 and side 303 of the unit 3 may be even.

Also referring to FIG. 4B, the surface between side 303 and side 304 of the unit 3 may be bonded to the conductive layer 41. The surface between side 303 and side 304 of the unit 3 may be uneven. Alternatively, the surface between side 303 and side 304 of the unit 3 may be even.

FIG. 5A through FIG. 5H illustrate a method for manufacturing a semiconductor package device in accordance with some embodiments of the present disclosure.

Figure 5A:
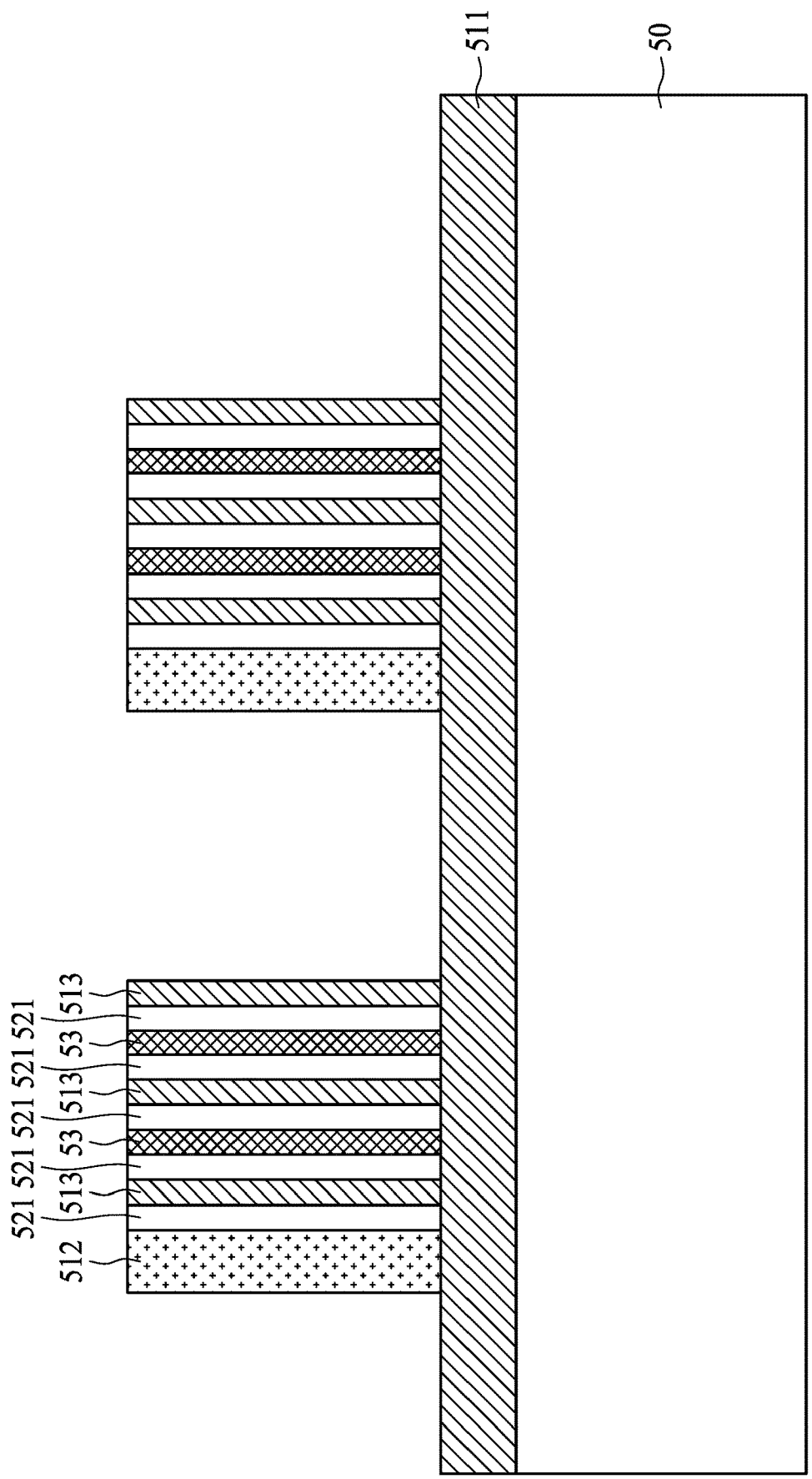

Referring to FIG. 5A, a carrier 50 is provided. The carrier 50 includes an insulative material. In one or more embodiments, the material of the carrier 50 may be, for example, a glass or other suitable materials. A conductive layer 511 can be provided on an upper surface of the carrier 50. The conductive layer 511 may include a conductive material. The conductive layer 511 may be, for example but is not limited to, copper (Cu), aluminum (Al), silver (Ag), graphite, metal, alloy, non-metal conductive material, or other suitable conductive material(s).

FIG. 5A, a semiconductor wall 512, conductive walls 513, insulation walls 521 and insulation walls 53 are together provided on the conductive layer 511. In one or more embodiments, the semiconductor wall 512, the conductive walls 513, the insulation walls 521 and the insulation walls 53 may be, for example, together bonded to the conductive layer 511. The insulation wall 521 may be between the semiconductor wall 512 and the conductive wall 513. The insulation wall 521 may be between the conductive wall 513 and the insulation wall 53.

Also referring to FIG. 5A, the semiconductor wall 512 may be disposed or erected on the conductive layer 511. The semiconductor wall 512 may be directly disposed or erected on the conductive layer 511. The semiconductor wall 512 may be in direct contact with the conductive layer 511. The semiconductor wall 512 may be electrically connected to the conductive layer 511.

The semiconductor wall 512 may include semi-conductive material(s). The semiconductor wall 512 may include, for example but is not limited to, silicon or other suitable material(s). The semiconductor wall 112 can include dopant. The semiconductor wall 512 can include n-type dopant or p-type dopant. The semiconductor wall 512 can include, for example but is not limited to, phosphorus (P) or other suitable material(s). The semiconductor wall 512 can include, for example but is not limited to, boron (B) or other suitable material(s).

Also referring to FIG. 5A, the conductive wall 513 may be disposed or erected on the conductive layer 511. The conductive wall 513 may be directly disposed or erected on the conductive layer 511. The conductive wall 513 may be in direct contact with the conductive layer 511. The conductive wall 513 may be electrically connected to the conductive layer 511. The conductive wall 513 may be electrically connected to the semiconductor wall 512. The conductive wall 513 may be electrically connected to the semiconductor wall 512 through the conductive layer 511. The conductive wall 513 may include material similar or the same to the conductive layer 511. The conductive wall 513 may include material different from the conductive layer 511. The conductive wall 513 may include, for example but is not limited to, copper (Cu), aluminum (Al), silver (Ag), graphite, metal, alloy, non-metal conductive material, or other suitable conductive material(s).

The conductive wall 513 can be disposed substantially in parallel to the semiconductor wall 512. One conductive wall 513 can be disposed substantially in parallel to another conductive wall 513.

Also referring to FIG. 5A, the insulation walls 521 may be directly disposed on the conductive layer 511. The insulation wall 521 may be disposed between the semiconductor wall 512 and the conductive wall 513. The insulation wall 521 may be disposed between one conductive wall 513 and one insulation wall 53. The insulation walls 521 may be electrically insulative. The insulation walls 521 may include, for example but is not limited to, oxide, nitride, or other suitable materials.

Also referring to FIG. 5A, the insulation walls 53 may be directly disposed on the conductive layer 511. The insulation wall 53 may be disposed between two insulation walls 521. The insulation walls 53 may be electrically insulative. The insulation walls 53 may include, for example but is not limited to, nitride, oxide, or other suitable materials. The material of the insulation walls 53 can be different from the material of the insulation walls 521.

Figure 5B:
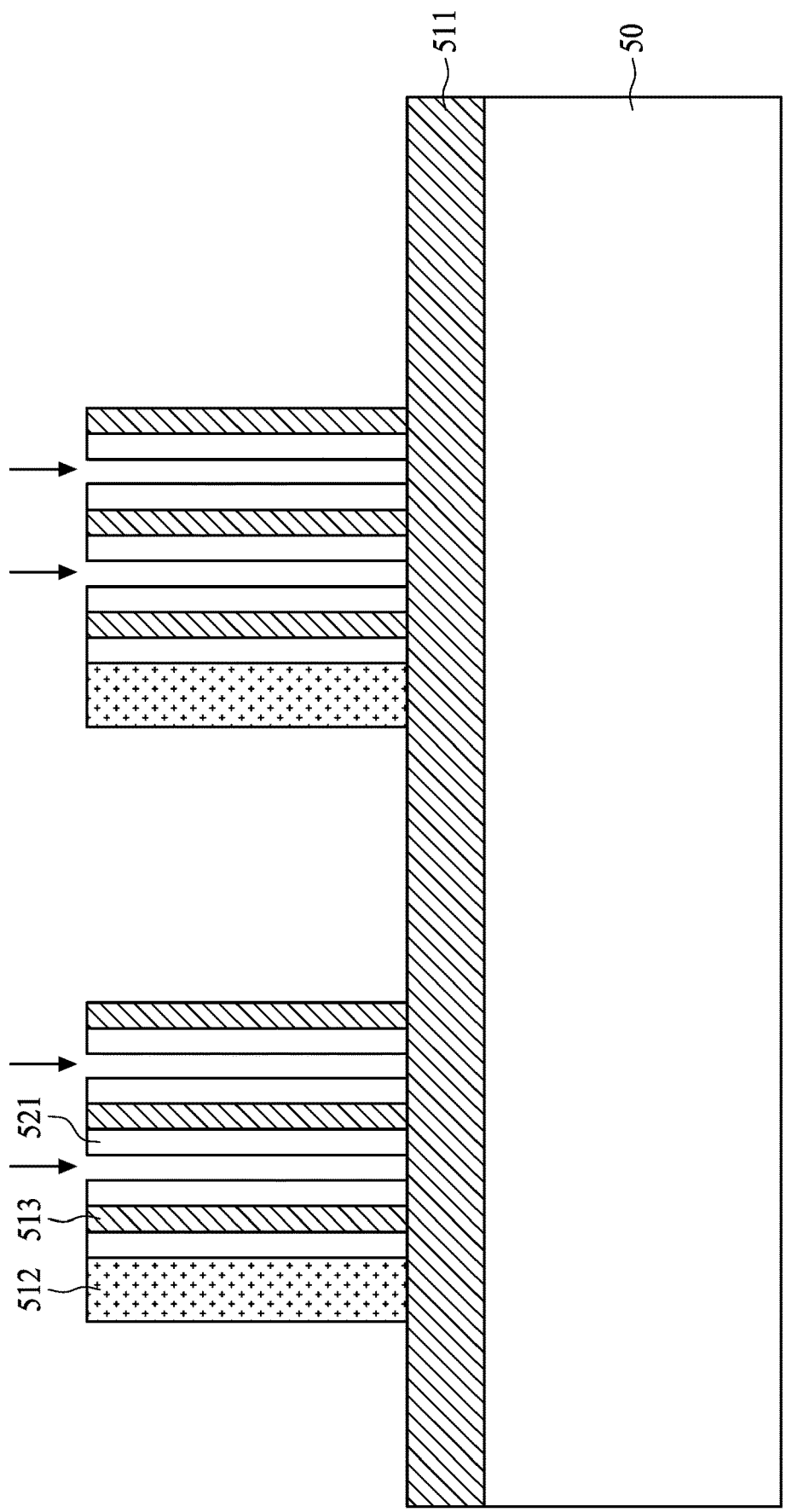

Referring to FIG. 5B, the insulation walls 53 are removed. The insulation walls 53 may be etched by an etchant. Due to different etch selectivity, the insulation walls 53 can be selectively removed, while the insulation walls 521 can be maintained on the conductive layer 511. The semiconductor wall 512 and the conductive walls 513 can be maintained on the conductive layer 511 as well.

Figure 5C:
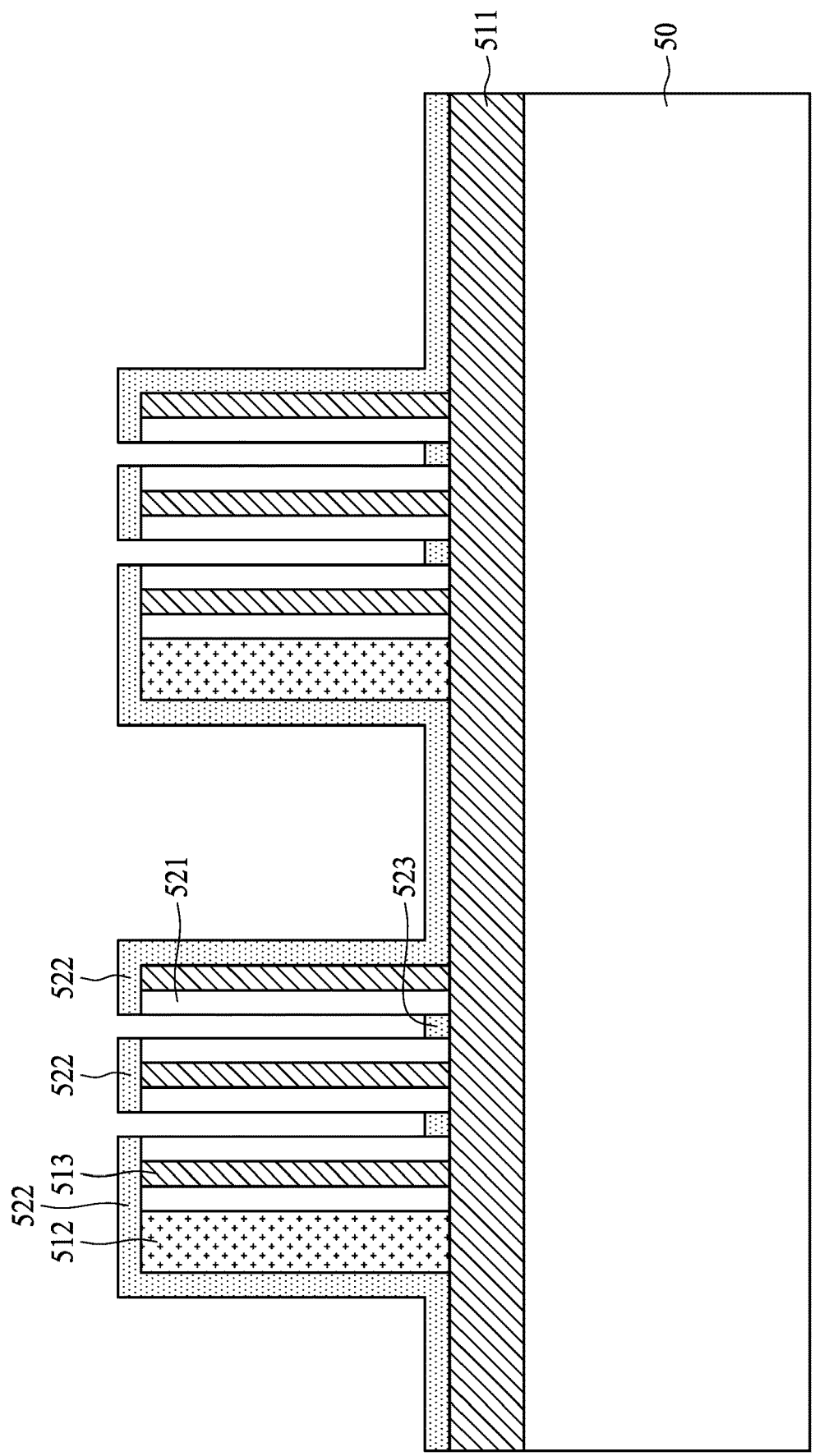

Referring to FIG. 5C, insulation layers 522 and insulation layers 523 can be formed. In one or more embodiments, the insulation layers 522 and the insulation layers 523 may be formed together by deposition.

Also referring to FIG. 5C, the insulation layers 522 may be formed by CVD, PVD, or other suitable fabrication process. The insulation layers 522 may be directly formed on the insulation walls 521. The insulation layers 522 may be directly formed on the conductive walls 513. The insulation layers 522 may cover the semiconductor wall 512. The insulation layers 522 may be directly formed on the conductive layer 511. The insulation layers 522 may be, for example but is not limited to, oxide, nitride, or other suitable materials. The material of the insulation layers 522 may be identical to or similar to the material of the insulation walls 521. Alternatively, the material of the insulation layers 522 may be different from the material of the insulation walls 521.

Also referring to FIG. 5C, the insulation layers 523 may be formed by CVD, PVD, or other suitable fabrication process. The insulation layers 523 may be directly formed on the conductive layer 511. The insulation layers 523 may be located between the insulation walls 521. The insulation layers 523 may be, for example but is not limited to, oxide, nitride, or other suitable materials. The material of the insulation layers 523 may be identical to or similar to the material of the insulation walls 521. Alternatively, the material of the insulation layers 523 may be different from the material of the insulation walls 521.

FIG. 5D is an enlarged cross-sectional view of FIG. 5C. FIG. 5D schematically illustrates the formation of an insulation portion 524 as well as the formation of the insulation layers 522 and the insulation layers 523.

Referring to FIG. 5D, the insulation layers 522, the insulation layers 523 and the insulation portion 524 may be formed together by CVD, PVD, or other suitable fabrication process. The insulation portion 524 may be, for example but is not limited to, oxide, nitride, or other suitable materials. The material of the insulation portion 524 may be identical to or similar to the material of the insulation walls 521. Alternatively, the material of the insulation portion 524 may be different from the material of the insulation walls 521.

As shown in FIG. 5D, the insulation portion 524 may be directly formed on the side surface of the insulation wall 521.

The insulation portion 524 may be a continuous layer (also can be referred to FIG. 1G or FIG. 1H) on the side surface of the insulation wall 521. The continuous layer may have a smooth surface. The continuous layer may have a rough surface. The continuous layer may extend from the insulation layer 522 toward the insulation layer 523. The insulation portion 524 may be in contact with the insulation layer 522. The insulation portion 524 may be in contact with the insulation layer 523.

The insulation portion 524 may be several isolated blocks (also can be referred to FIG. 1I) on the side surface of the insulation wall 521.

The insulation portion 524 may be several isolated islands (also can be referred to FIG. 1J) on the side surface of the insulation wall 521.

Figure 5E:
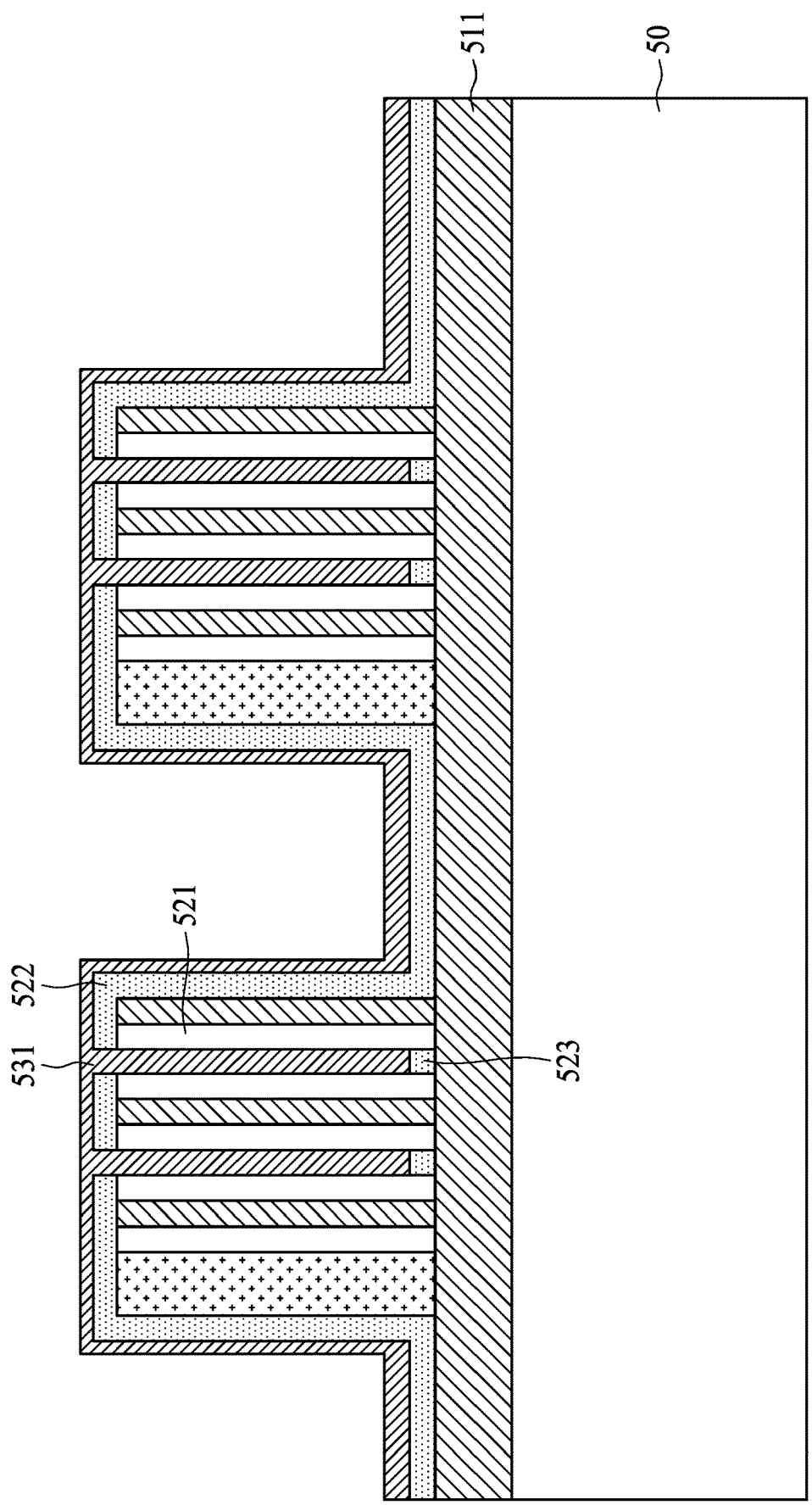

Referring to FIG. 5E, a conductive element 531 can be formed. The conductive element 531 may be formed by PVD or other suitable fabrication process. The conductive element 531 may cover the insulation layers 521. The conductive element 531 may cover the insulation layers 522. The conductive element 531 may cover the insulation walls 523. The conductive element 531 may also cover the insulation portion 524 (shown in FIG. 5D). The conductive element 531 may be electrically conductive. The conductive element 531 may include, for example but is not limited to, copper (Cu), aluminum (Al), silver (Ag), graphite, metal, alloy, aluminum-copper alloy (AlCu), non-metal conductive material, or other suitable material(s).

Figure 5F:
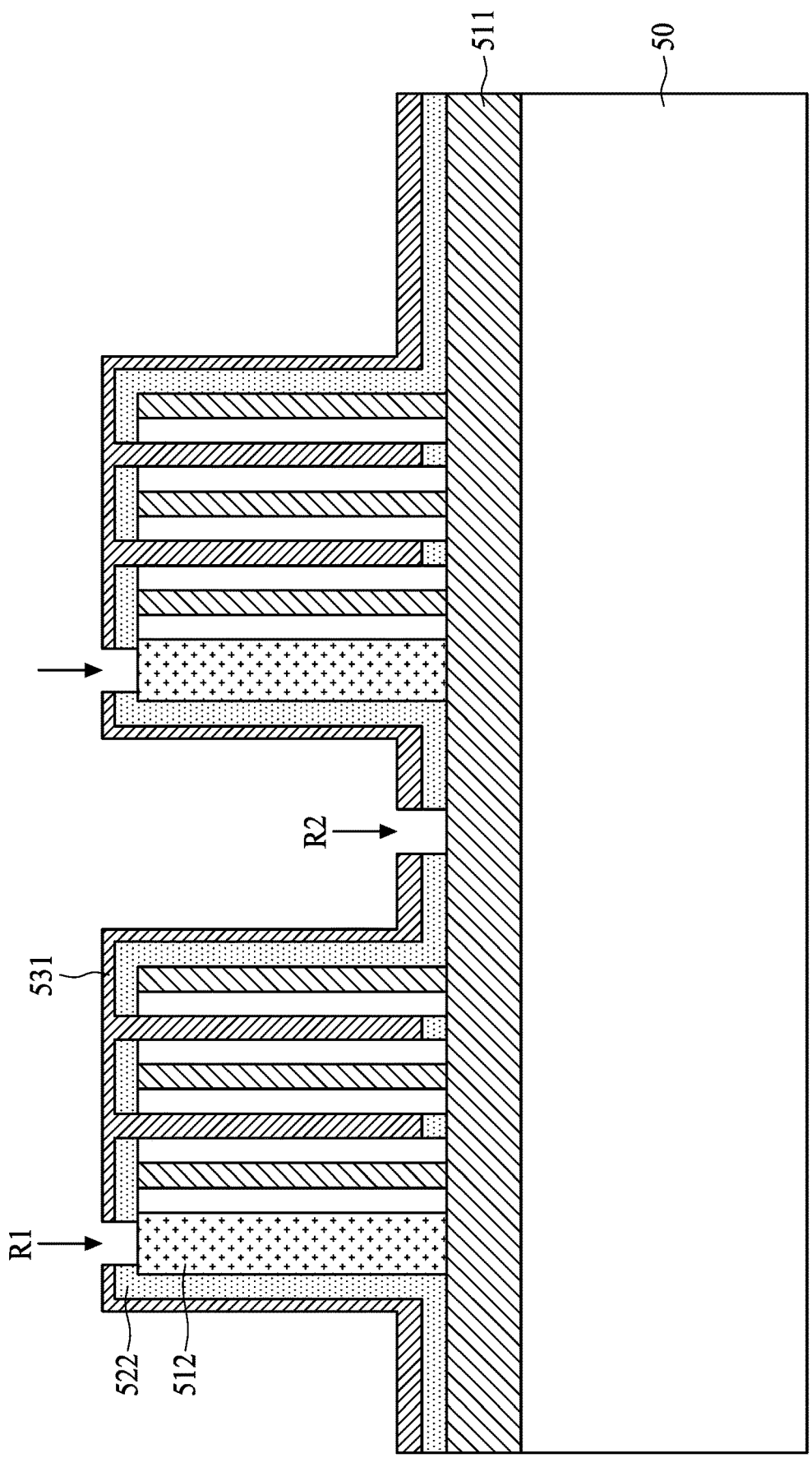

Referring to FIG. 5F, a portion of the conductive element 531 and a portion of the insulation layer 522 can be removed.

The portion of the conductive element 531 and the portion of the insulation layer 522 which may be above the semiconductor wall 512 is defined as region R1. Region R1 may be etched away. After removing region R1, the upper surface of the semiconductor wall 512 can be exposed.

The portion of the conductive element 531 and the portion of the insulation layer 522 which may be above the conductive layer 511 is defined as region R2. Region R2 may be etched away. Once removing region R2, the upper surface of the conductive layer 511 may be exposed and several individual semiconductor package devices may be separated. Alternatively, region R2 may not be removed.

Figure 5G:
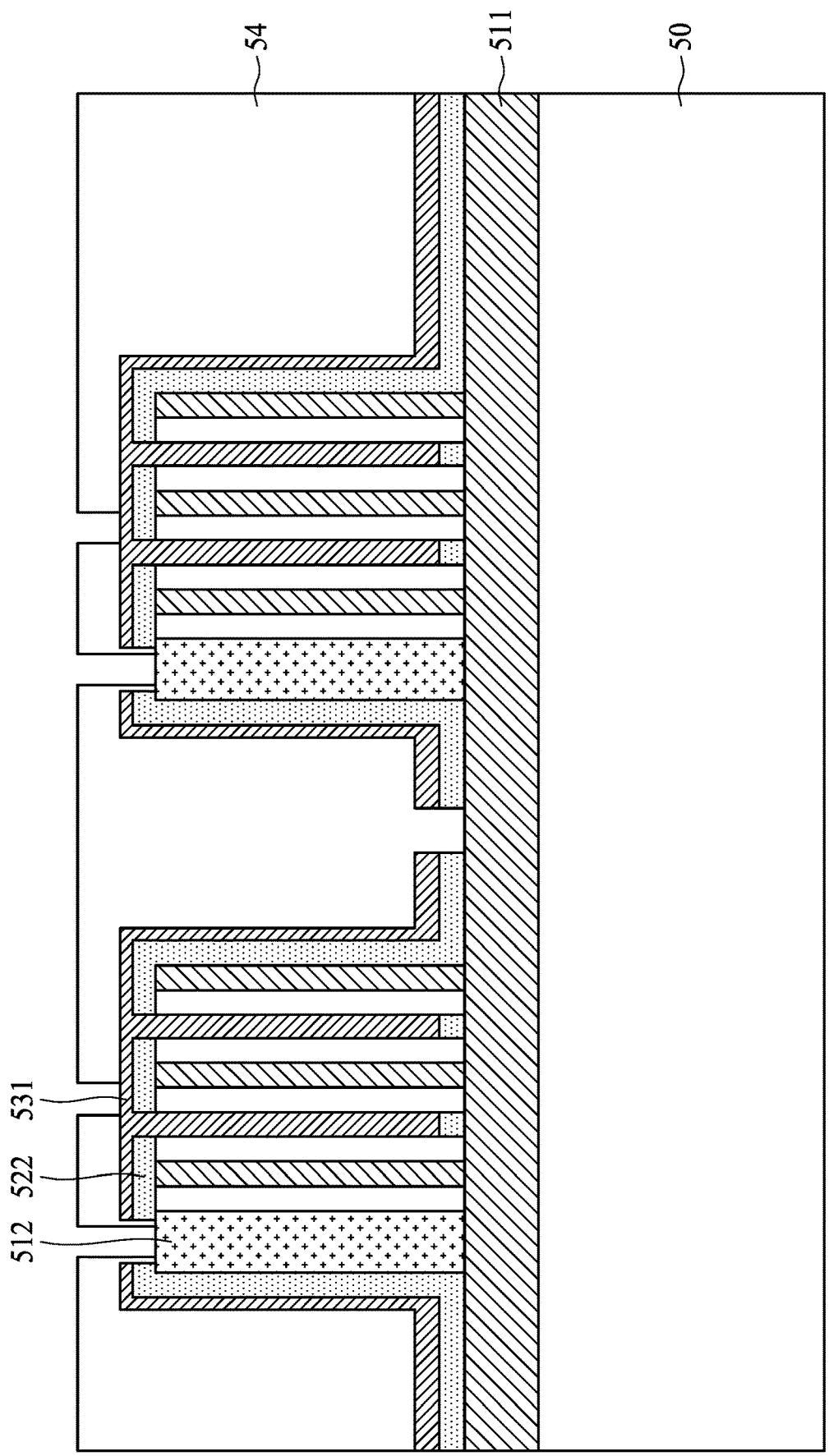

Referring to FIG. 5G, a passivation layer 54 can be formed. The passivation layer 54 may be formed by, for example, deposition and masking or other suitable fabrication process. The passivation layer 54 may cover a portion of the semiconductor wall 512. The other portion of the semiconductor wall 512 which is not covered by the passivation layer 54 can be exposed. The passivation layer 54 may also cover the insulation layers 522 and the conductive element 531. The formation of the passivation layer 54 may prevent the semiconductor wall 512 from contacting the conductive element 531.

The passivation layer 54 may be disposed on the conductive element 531. The passivation layer 54 may be disposed in direct contact with the conductive element 531. The passivation layer 54 may cover the conductive element 531. The passivation layer 54 may cover a portion of the conductive element 531. The other portion of the conductive element 531 which is not covered by the passivation layer 54 can be exposed.

The passivation layer 54 may be disposed on the conductive layer 511. The passivation layer 54 may be disposed in direct contact with the conductive layer 511. The passivation layer 54 may cover the insulation layer 522 and the conductive element 531 as well. The formation of the passivation layer 54 may prevent the conductive layer 511 from contacting the conductive element 531.

Also referring to FIG. 5G, the passivation layer 54 may be electrically insulative. The passivation layer 54 may be, for example but is not limited to, polyimide or other suitable material(s).

Figure 5H:
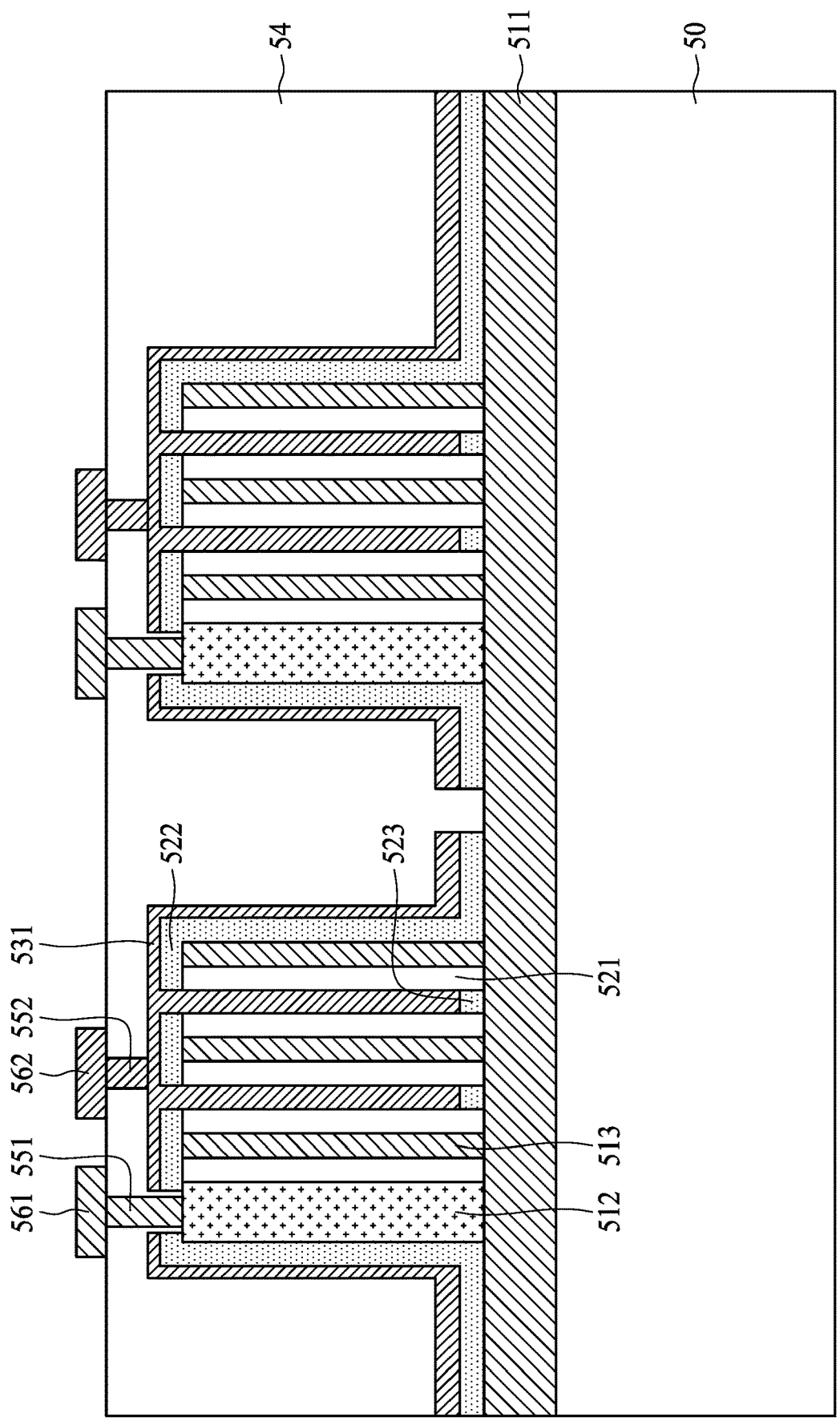

Referring to FIG. 5H, a connection element 551 can be formed on the exposed portion of the semiconductor wall 512. The connection element 551 may be formed by CVD, PVD or other suitable fabrication process. The connection element 551 may be disposed on the semiconductor wall 512. The connection element 551 may be disposed in direct contact with the semiconductor wall 512. The connection element 551 may be electrically conductive. The connection element 551 may be electrically connected to the semiconductor wall 512. The connection element 551 may include, for example but is not limited to, copper, another metal, or other suitable conductive materials.

Also referring to FIG. 5H, a connection element 552 can be formed on the exposed portion of the conductive element 531. The connection element 552 may be formed by CVD, PVD or other suitable fabrication process. The connection element 552 may be disposed on the conductive element 531. The connection element 552 may be disposed in direct contact with the conductive element 531. The connection element 552 may be electrically conductive. The connection element 552 may be electrically connected to the conductive element 531. The connection element 552 may include, for example but is not limited to, copper, another metal, or other suitable conductive materials.

The connection element 551 and the connection element 552 may be formed simultaneously.

Also referring to FIG. 5H, a patterned conductive layer 561 can be formed on the connection element 551. The patterned conductive layer 561 may be formed by plating, deposition or other suitable fabrication process. The patterned conductive layer 561 may be disposed on the connection element 551. The patterned conductive layer 561 may be disposed in direct contact with the connection element 551. The patterned conductive layer 561 may be electrically conductive. The patterned conductive layer 561 may be electrically connected to the connection element 551. The patterned conductive layer 561 may be electrically connected to the semiconductor wall 512 through the connection element 551. The patterned conductive layer 561 may provide or facilitate external connection. The patterned conductive layer 561 may include, for example, copper, another metal, or other suitable conductive materials.

Also referring to FIG. 5H, a patterned conductive layer 562 can be formed on the connection element 552. The patterned conductive layer 562 may be formed by plating, deposition or other suitable fabrication process. The patterned conductive layer 562 may be disposed on the connection element 552. The patterned conductive layer 562 may be disposed in direct contact with the connection element 552. The patterned conductive layer 562 may be electrically conductive. The patterned conductive layer 562 may be electrically connected to the connection element 552. The patterned conductive layer 562 may be electrically connected to the conductive element 531 through the connection element 552. The patterned conductive layer 562 may provide or facilitate external connection. The patterned conductive layer 562 may include, for example, copper, another metal, or other suitable conductive materials.

The patterned conductive layer 561 and the patterned conductive layer 562 may be formed simultaneously.

FIG. 5H also can illustrate a capacitor structure. The capacitor structure includes a lower electrode, an upper electrode and an insulation structure therebetween. The lower electrode may include the conductive layer 511, the semiconductor wall 512 and the conductive walls 513. The lower electrode may electrically connect to the patterned conductive layer 561 through the connection element 551. The upper electrode may include the conductive element 531. The upper electrode may electrically connect to the patterned conductive layer 562 through the connection element 552. The insulation structure may include the insulation walls 521, the insulation layers 522 and the insulation layers 523. The insulation structure may further include the insulation portion 524 (as shown in FIG. 5D). The upper electrode may be separated from the lower electrode by the passivation layer 54.

Figure 6:
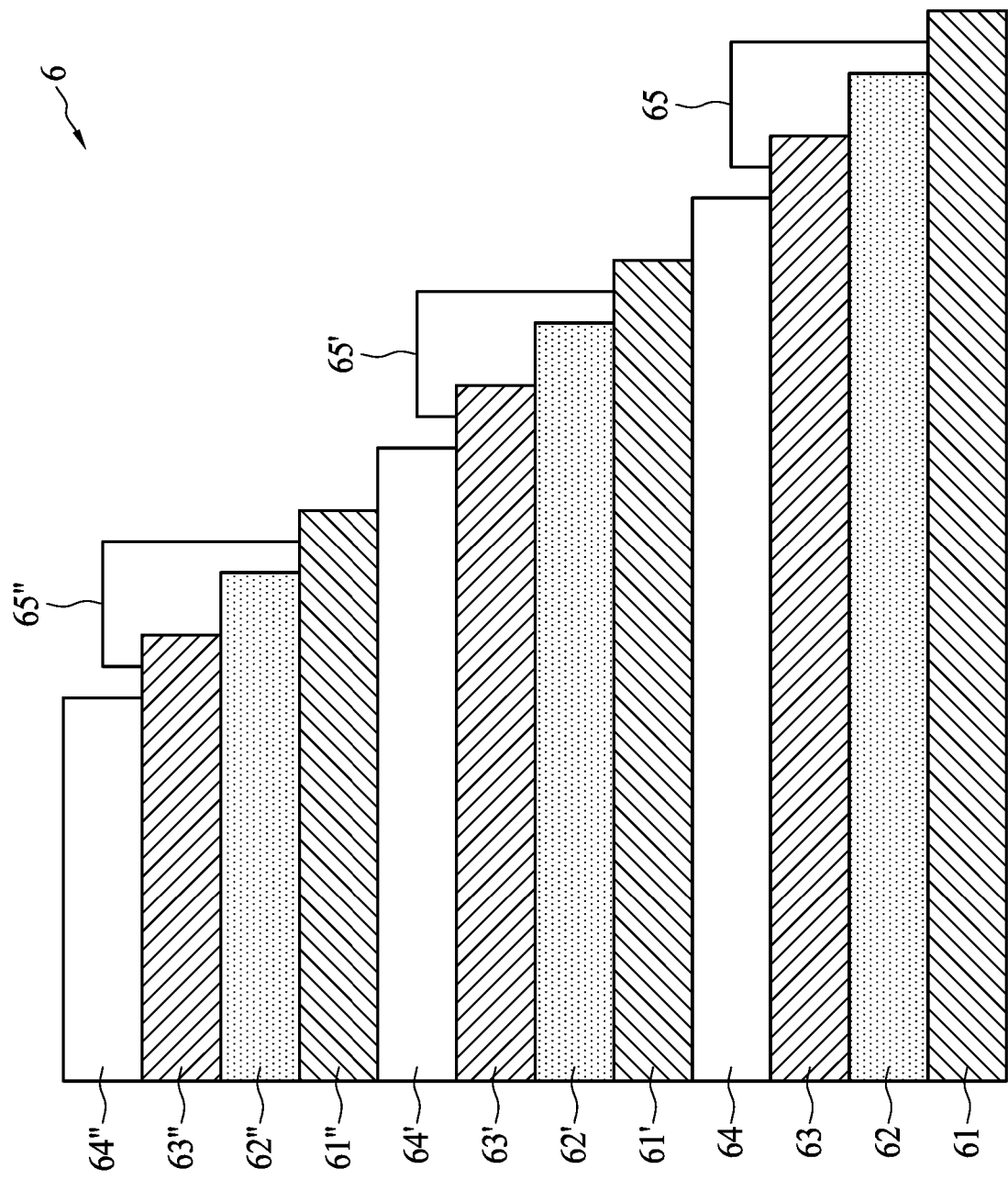
FIG. 6 illustrates a semiconductor package device in accordance with some comparative embodiments of the present disclosure.

FIG. 6 illustrates a semiconductor package device in accordance with some comparative embodiments of the present disclosure.

Referring to FIG. 6, the semiconductor package device 6 may include a stacked structure. The stacked structure can include electrodes 61, 61', 61", 63, 63' and 63", insulation layers 62, 62' and 62" and passivation layers 64, 64' and 64". The stacked structure may include some capacitors. For example, electrode 61, insulation layer 62 and electrode 63 may function as a metal-insulator-metal (MIM) capacitor. For example, electrode 61', insulation layer 62' and electrode 63' may also function as another MIM capacitor. For example, electrode 61", insulation layer 62" and electrode 63" may also function as another MIM capacitor.

Although twelve stacked layers are illustrated in FIG. 6, it may be contemplated that the semiconductor package device 6 may include more or less layers in accordance with some other embodiments of the subject application. For example, the semiconductor package device 6 may include more stacked layers to increase capacitance (or capacitor) in a given area or a predetermined area. In other words, the semiconductor package device 6 may include more stacked layers in order to increase capacitor density or capacitance density, which may inevitably increase elevation or thickness of the semiconductor package device 6.

The MIM capacitor, which includes electrode 61, insulation layer 62 and electrode 63, may specify a conductive contact 65. The MIM capacitor, which includes electrode 61', insulation layer 62' and electrode 63', may specify a conductive contact 65'. The MIM capacitor, which includes electrode 61", insulation layer 62" and electrode 63", may specify a conductive contact 65". As the stacked layers or MIM capacitors augment, relatively more conductive contact(s) (e.g. conductive contacts 65, 65', 65" and so forth) are specified to accumulate charges on each of the electrodes, which may inevitably increase layout or horizontal space of the semiconductor package device 6. In other words, deployment of the conductive contact(s) (e.g. conductive contact 65, 65', 65" and so forth) may occupy layout of the semiconductor package device 6 which may adversely affect circuit design. Lithography, etching, deposition, plating, or other technique(s) may be used to form the semiconductor package device 6.

As used herein, the singular terms "a," "an," and "the" may include plural referents unless the context clearly dictates otherwise. In the description of some embodiments, a component provided or disposed "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

As used herein, the terms "approximately," "substantially," "substantial," "around" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package device, comprising:
    a first conductive layer having conductive grains of a first average size;
    a first conductive wall disposed directly on the first conductive layer, the first conductive wall having conductive grains of a second average size;
    a semiconductor wall disposed on the first conductive layer and at one side of the first conductive wall; and
    an insulation layer disposed on the first conductive layer, wherein the first average size is different from the second average size.

2. The semiconductor package device of claim 1, wherein the first average size is greater than the second average size.

3. The semiconductor package device of claim 1, wherein the first average size is substantially identical to the second average size.

4. The semiconductor package device of claim 2, further comprising:
    a second conductive wall disposed on the first conductive layer and separated from the first conductive layer by the insulation layer.

5. The semiconductor package device of claim 4, wherein:
    the second conductive wall is separated from the first conductive wall by the insulation layer.

6. The semiconductor package device of claim 1, wherein:
    the first conductive wall is surrounded by the insulation layer.

7. The semiconductor package device of claim 1, wherein the semiconductor wall is electrically connected to the first conductive layer.

8. The semiconductor package device of claim 7, wherein:
    the semiconductor wall is electrically connected to the first conductive wall through the first conductive layer.

* * * * *